United States Patent
Suzuki et al.

(10) Patent No.: US 10,424,731 B2
(45) Date of Patent: Sep. 24, 2019

(54) MEMORY DEVICE

(71) Applicant: Toshiba Memory Corporation, Minato-ku (JP)

(72) Inventors: Kunifumi Suzuki, Yokkaichi (JP); Kazuhiko Yamamoto, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/808,584

(22) Filed: Jul. 24, 2015

(65) Prior Publication Data

US 2016/0268503 A1 Sep. 15, 2016

Related U.S. Application Data

(60) Provisional application No. 62/133,143, filed on Mar. 13, 2015.

(51) Int. Cl.
*H01L 45/00* (2006.01)
*H01L 27/24* (2006.01)

(52) U.S. Cl.
CPC .......... *H01L 45/144* (2013.01); *H01L 45/085* (2013.01); *H01L 45/126* (2013.01); *H01L 45/1233* (2013.01); *H01L 27/2409* (2013.01); *H01L 27/2481* (2013.01)

(58) Field of Classification Search
CPC ......... H01L 45/141–144; H01L 45/122–1246; H01L 45/08–085; H01L 45/00–1691
See application file for complete search history.

(56) References Cited

U.S. PATENT DOCUMENTS

| 7,718,990 | B2 | 5/2010 | Sandoval | |
|---|---|---|---|---|
| 2006/0039192 | A1* | 2/2006 | Ha | H01L 45/1233 365/163 |
| 2007/0285969 | A1* | 12/2007 | Toda | G11C 8/08 365/148 |
| 2008/0116440 | A1 | 5/2008 | Ho et al. | |
| 2009/0280599 | A1* | 11/2009 | Im | H01L 45/06 438/102 |
| 2009/0303774 | A1 | 12/2009 | Ho et al. | |
| 2010/0072451 | A1 | 3/2010 | Terao et al. | |
| 2010/0096613 | A1 | 4/2010 | Morikawa et al. | |

(Continued)

FOREIGN PATENT DOCUMENTS

JP    2013-051245    3/2013

OTHER PUBLICATIONS

Combined Office Action and Search Report dated Aug. 16, 2016 in Taiwanese Patent Application No. 104128904 (with English translation).

*Primary Examiner* — Xinning (Tom) Niu
*Assistant Examiner* — Sean P Hagan
(74) *Attorney, Agent, or Firm* — Oblon, McClelland, Maier & Neustadt, L.L.P.

(57) ABSTRACT

According to one embodiment, a memory device includes a first electrode; a variable resistance layer provided on the first electrode, the variable resistance layer including a chalcogenide compound having a crystal structure; and a second electrode provided on the variable resistance layer. The variable resistance layer includes a first region covering one of an upper surface of the first electrode or a lower surface of the second electrode, and a second region, a concentration of the chemical element being lower in the second region than in the first region.

19 Claims, 12 Drawing Sheets

(56) References Cited

U.S. PATENT DOCUMENTS

| | | | |
|---|---|---|---|
| 2010/0108972 A1* | 5/2010 | Zhao | B82Y 10/00 257/2 |
| 2010/0177553 A1* | 7/2010 | Lee | G11C 13/0004 365/148 |
| 2010/0264397 A1* | 10/2010 | Xia | H01L 27/101 257/4 |
| 2011/0049456 A1* | 3/2011 | Lung | H01L 45/06 257/2 |
| 2011/0175048 A1* | 7/2011 | Sekine | H01L 27/2409 257/2 |
| 2011/0176353 A1* | 7/2011 | Li | B82Y 10/00 365/148 |
| 2011/0233507 A1 | 9/2011 | Sonehara et al. | |
| 2011/0315942 A1* | 12/2011 | Tominaga | G11C 13/0004 257/1 |
| 2012/0018695 A1 | 1/2012 | Lee et al. | |
| 2013/0037773 A1* | 2/2013 | Strukov | H01L 45/08 257/2 |
| 2014/0063924 A1 | 3/2014 | Nakai et al. | |

* cited by examiner

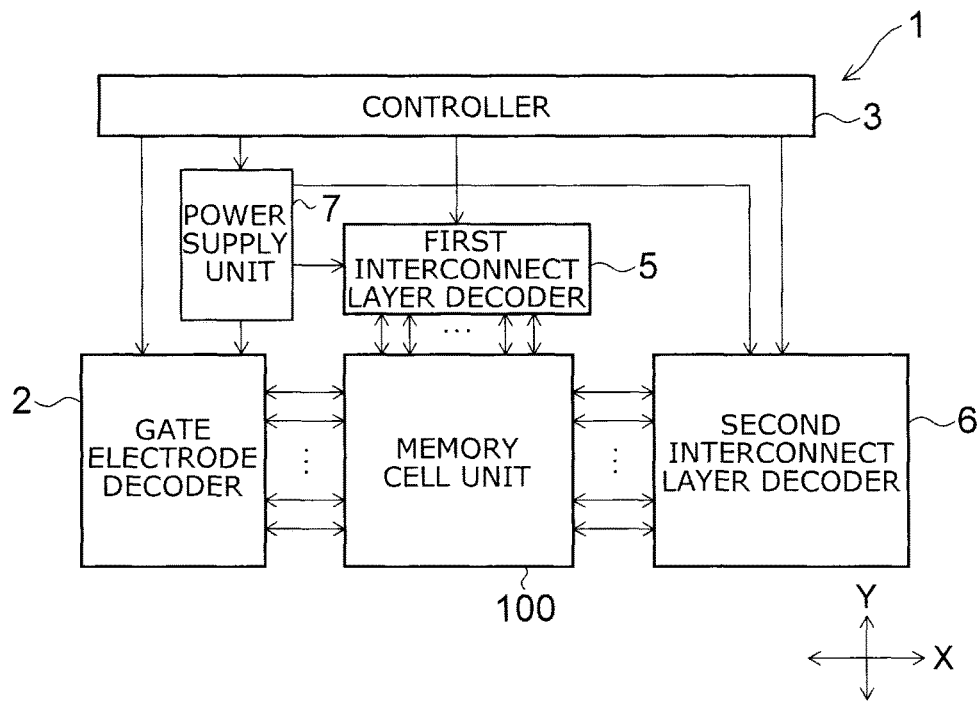
FIG. 1A
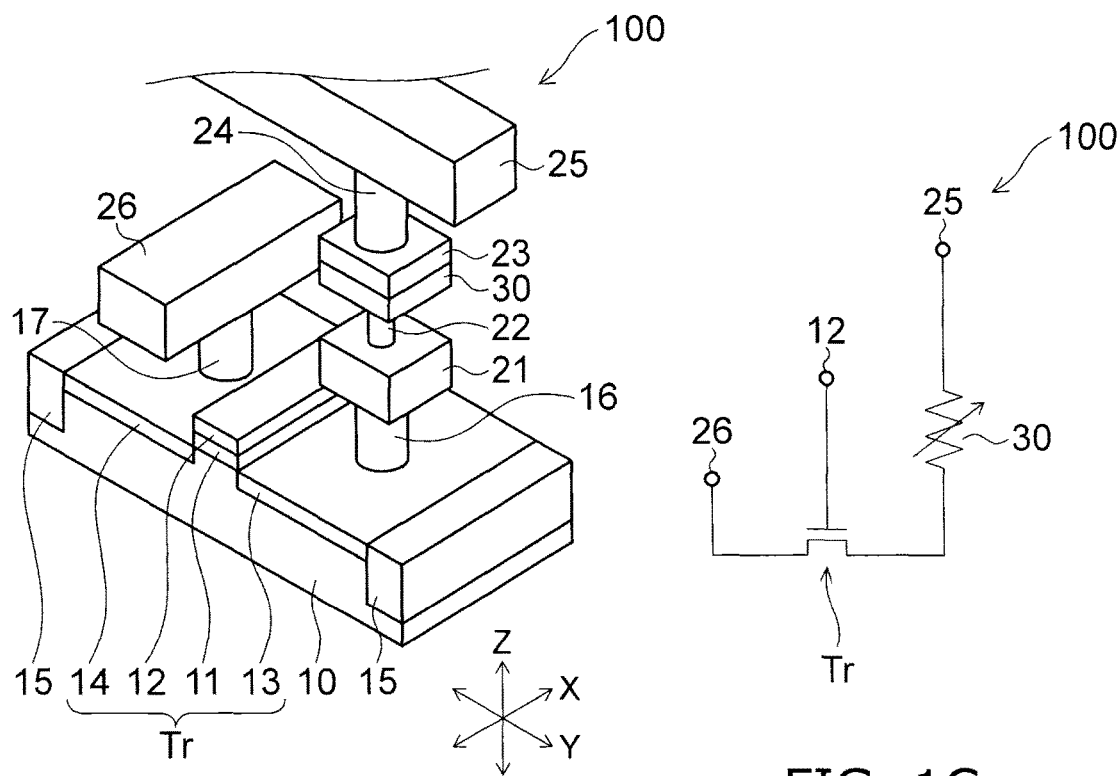
FIG. 1B
FIG. 1C

MEMORY DEVICE

CROSS-REFERENCE TO RELATED APPLICATIONS

This application is based upon and claims the benefit of priority from U.S. Provisional Patent Application 62/133,143 filed on Mar. 13, 2015; the entire contents of which are incorporated herein by reference.

FIELD

Embodiments described herein relate generally to a memory device.

BACKGROUND

Generally, in a resistance random access memory device, electrodes are formed to have a variable resistance unit interposed. Information is stored by changing the resistance state of the variable resistance unit by supplying a current to the variable resistance unit. For the resistance random access memory device recited above, there are expectations for a variable resistance unit that can be controlled by a low voltage and a low current.

BRIEF DESCRIPTION OF THE DRAWINGS

FIG. 1A is a circuit diagram of a memory device of a first embodiment, FIG. 1B is a schematic perspective view of a memory cell unit of the first embodiment, and FIG. 1C is a circuit diagram of the memory cell unit of the first embodiment;

DETAILED DESCRIPTION

Figure 2A:
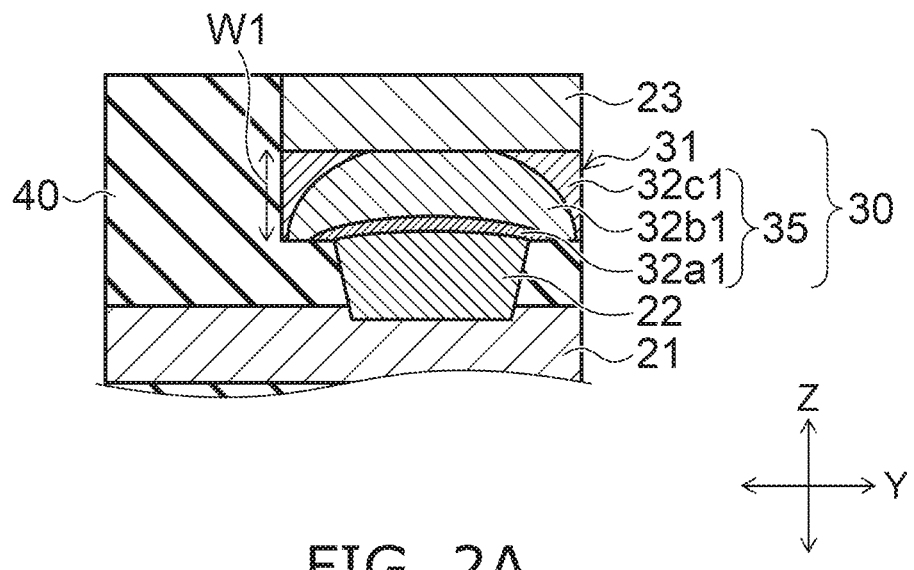
FIG. 2A and FIG. 2B are schematic cross-sectional views of a variable resistance layer of the first embodiment.

According to one embodiment, a memory device includes a first electrode; a variable resistance layer provided on the first electrode, the variable resistance layer including a chalcogenide compound having a crystal structure; and a second electrode provided on the variable resistance layer. The variable resistance layer includes at least one chemical element of germanium, silicon, or carbon, the variable resistance layer is configured to be able to include a first region and a second region. The first region covers one of an upper surface of the first electrode or a lower surface of the second electrode. A concentration of the chemical element is lower in the second region than in the first region.

First Embodiment

FIG. 1A is a circuit diagram of a memory device 1 of the embodiment; and FIG. 1B is a schematic perspective view of a memory cell unit 100 of the embodiment. In FIG. 1B, the insulating layers of the periphery, etc., are not shown for easier viewing of the drawing.

FIG. 1C is a circuit diagram of the memory cell unit 100 of the embodiment.

In FIG. 1A to FIG. 1C, two mutually-orthogonal directions are taken as an X-direction and a Y-direction; and a direction in which the device is stacked that intersects the X-direction and the Y-direction (the XY plane) is taken as a Z-direction.

As shown in FIG. 1A and FIG. 1B, the memory device 1 of the embodiment includes the memory cell unit 100, a controller 3, a gate electrode decoder 2, a first interconnect layer decoder 5, a second interconnect layer decoder 6, and a power supply unit 7. The memory cell unit 100 includes a variable resistance layer 30 (a variable resistance unit) and a transistor Tr.

The controller 3 controls the operations of the memory device 1. The controller 3 performs the control of a set operation, a reset operation, a read-out operation, etc., of the memory cell unit 100 via the gate electrode decoder 2, the first interconnect layer decoder 5, and the second interconnect layer decoder 6.

The power supply unit 7 supplies a voltage to each unit based on a signal from the controller 3. For example, the power supply unit 7 supplies the voltage to the gate electrode decoder 2, the first interconnect layer decoder 5, and the second interconnect layer decoder 6. The set operation, the reset operation, the read-out operation, etc., of the memory cell unit 100 are executed using the voltage.

The gate electrode decoder 2 is electrically connected to a gate electrode 12 of the memory cell unit 100. The first interconnect layer decoder 5 is electrically connected to a first interconnect layer 25 of the memory cell unit 100. The second interconnect layer decoder 6 is electrically connected to a second interconnect layer 26 of the memory cell unit 100. The decoders 2, 5, and 6 apply prescribed voltages to the gate electrode 12, the first interconnect layer 25, and the second interconnect layer 26 corresponding to the selected variable resistance layer 30 and transistor Tr of the multiple variable resistance layers 30 and the multiple transistors Tr. Thereby, the reprogramming and reading of the information stored in the selected variable resistance layer 30 can be performed.

As shown in FIG. 1B, a substrate 10 is provided in the memory cell unit 100 of the embodiment. A gate insulator film 11 is provided on the substrate 10. The gate electrode (the word line) 12 is provided on the gate insulator film 11. Source/drain regions 13 and 14 are provided in the upper portion of the substrate 10 with the region directly under the gate insulator film 11 interposed between the source/drain regions 13 and 14.

The gate insulator film 11, the gate electrode 12, and the source/drain regions 13 and 14 are included in the transistor Tr. The region between the source/drain regions 13 and 14 of the substrate 10 functions as a channel of the transistor Tr.

An isolation area 15 is provided around the transistor Tr. The isolation area 15 contacts the source/drain regions 13 and 14. An electrode layer 21 is provided on the source/drain region 13 with a contact 16 interposed. A first electrode 22 is provided on the electrode layer 21. The variable resistance layer 30 is provided on the first electrode 22. A second electrode 23 is provided on the variable resistance layer 30. The first interconnect layer 25 (the bit line) extends in the Y-direction and is provided on the second electrode 23 with a contact 24 interposed. In other words, the first interconnect layer 25 is electrically connected to the source/drain region 13 via the variable resistance layer 30.

The second interconnect layer 26 is provided on the source/drain region 14 with a contact 17 interposed. In other words, the second interconnect layer 26 is electrically connected to the source/drain region 14.

As described below, the state (the concentration distribution of a chemical element 35 described below) inside the variable resistance layer 30 changes due to the effects of heat and at least one of an electric field or stress applied to the variable resistance layer 30. Thereby, the resistance value of the variable resistance layer 30 changes; and data can be stored. That is, for example, the variable resistance layer 30 can store the data by using the low resistance state of the variable resistance layer 30 as "1" and using the high resistance state as "0." That is, it is possible to use the variable resistance layer 30 as memory.

The second interconnect layer 26 (the source layer) is provided on the source/drain region 14 with the contact 17 interposed. The second interconnect layer 26 extends in the X-direction. The second interconnect layer 26 is electrically connected to the transistor Tr.

Using the configuration recited above in the memory cell unit 100 of the embodiment as shown in FIG. 1C, one variable resistance layer 30 and one transistor Tr are provided by being connected in series between the first interconnect layer 25 and the second interconnect layer 26 (a 1T1R structure).

(Basic Configuration of Variable Resistance Layer 30)
The basic configuration and states of the variable resistance layer 30 will now be described using FIG. 2A and FIG. 2B. The operation method for changing the resistance of the variable resistance layer 30 is described below.

The basic configuration of the variable resistance layer 30 will now be described with reference to FIG. 2A.

FIG. 2A is a schematic cross-sectional view of the variable resistance layer 30 of the embodiment. In FIG. 2A, the structures under the electrode layer 21 and on the second electrode 23 are not shown.

As shown in FIG. 2A, the variable resistance layer 30 includes a chalcogenide compound 31. Also, the variable resistance layer 30 includes the chemical element 35. For example, the chemical element 35 may be included inside the crystal structure of the chalcogenide compound 31 or may be precipitated inside the variable resistance layer 30.

A thickness W1 in the Z-direction of the variable resistance layer 30 is, for example, 50 nm or less.

The chalcogenide compound 31 is provided on the first electrode 22. The chalcogenide compound 31 has a crystal structure and has the c-axis orientation. In the embodiment, the "c-axis" is, for example, the Z-direction. Both a first state F1 and a second state F2 of the variable resistance layer 30 described below have crystal structures and have the c-axis orientation.

For example, the chalcogenide compound 31 includes a compound of at least one type of chemical element selected from a first group and a second group described below and at least one type of chemical element selected from a third group described below. In the embodiment, the chalcogenide compound 31 is, for example, $Sb_2Te_3$ which is a compound of antimony and tellurium. The electrical resistivity of the chalcogenide compound 31 is, for example, 1000 μΩ-cm or less.

The first group includes, for example, each of germanium, silicon, and carbon. For example, the second group includes each of titanium, vanadium, copper, zinc, chrome, zirconium, platinum, palladium, molybdenum, nickel, manganese, hafnium, bismuth, and antimony. The third group includes, for example, each of sulfur, selenium, and tellurium.

The chemical element 35 includes, for example, at least one of germanium, silicon, or carbon. In the embodiment, the chemical element 35 is germanium.

The first electrode 22 and the second electrode 23 include, for example, a material having a low diffusion coefficient of the chemical element 35, e.g., titanium nitride.

(States of Variable Resistance Layer 30)
An example of the states of the variable resistance layer 30 will now be described with reference to FIG. 2A and FIG. 2B. Here, an example of the variable resistance layer 30 is described in which the potential of the first electrode 22 is lower than the potential of the second electrode 23. Descriptions of other examples of the variable resistance layer 30 and descriptions of the variable resistance layer 30 when the potential of the first electrode 22 is higher than the potential of the second electrode 23 are recited below.

Figure 2B:
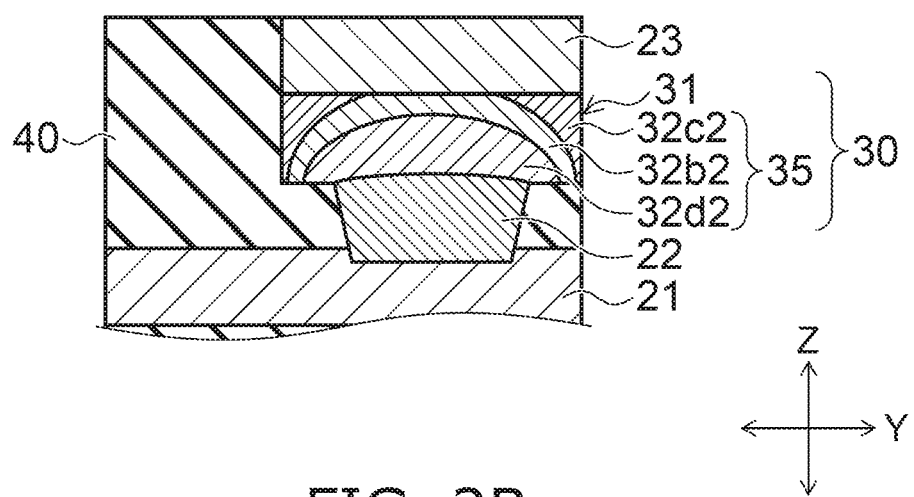

The variable resistance layer 30 has the first state F1 shown in FIG. 2A and the second state F2 shown in FIG. 2B. The first state F1 substantially corresponds to the high resistance state in which the electrical resistance is high. The second state F2 substantially corresponds to the low resistance state in which the electrical resistance is low. The first state F1 and the second state F2 are electrically switchable. As described above, by using each of the states as data of "0" or "1," the variable resistance layer 30 nonvolatilely stores the data. The states of the variable resistance layer 30 are formed respectively by a set operation S110 or a reset operation S150 described below.

The first state F1 shown in FIG. 2A will now be described.

As shown in FIG. 2A, the first region 32a1 that covers the upper surface of the first electrode 22 is provided inside the variable resistance layer 30 (a first cell) in the first state F1. The first region 32a1 contacts the upper surface of the first electrode 22. The first region 32a1 covers the upper surface of the first electrode 22. The upper surface of the first region 32a1 is covered with a second region 32b1. The first region 32a1 contacts the second region 32b1.

The second region 32b1 contacts the lower surface of the second electrode 23. The second region 32b1 contacts a third region 32c1.

The third region 32c1 is provided in a region other than the region where the first region 32a1 and the second region 32b1 are provided. The third region 32c1 contacts the second electrode 23.

The concentration of the chemical element 35 in the first region 32a1 is higher than the concentration in the second region 32b1 and the third region 32c1. The concentration of the chemical element 35 in the third region 32c1 is not less than the concentration in the second region 32b1.

In other words, the concentration of the chemical element 35 for the regions 32a1, 32b1, and 32c1 is expressed using inequality signs in Formula (1).

$$\text{first region } 32a1 > \text{third region } 32c1 \geq \text{second region } 32b1 \qquad (1)$$

For example, EDX (Energy dispersive X-ray spectrometry) or the like is used as the method for measuring the concentration of the chemical element 35 inside the variable resistance layer 30. Also, a measurement method may be used that detects the characteristic X-ray that is emitted when an X-ray, radiated light, or the like is irradiated on the variable resistance layer 30.

In the embodiment, the inventors confirmed the concentration difference described above by measuring the concentration of the chemical element 35 (the first region 32a1, the second region 32b1, the third region 32c1, etc.) using EDX. For example, the concentration of the chemical element 35 is expressed by the number per unit volume (atoms/cm^3).

The method for forming the first state F1 is, for example, as follows. A more detailed description is described below as the operation method. For example, the chemical element 35 has a positively charged state or a positive ion state. Therefore, when a voltage is applied between the first electrode 22 and the second electrode 23, the chemical element 35 collects on the side of the electrode having the low voltage. In other words, the first region 32a1, the second region 32b1, and the third region 32c1 are provided by a concentration gradient of the chemical element 35 occurring inside the variable resistance layer 30.

That is, the first region 32a1 is provided on a line inside the variable resistance layer 30 linking the first electrode 22 and the second electrode 23 for the variable resistance layer 30 in the first state F1. In other words, the first region 32a1 is provided in the current path between the first electrode 22 and the second electrode 23. Thereby, the resistance of the variable resistance layer 30 in the first state F1 becomes high.

The second state F2 shown in FIG. 2B will now be described.

As shown in FIG. 2B, the fourth region 32d2 that covers the upper surface of the first electrode 22 is provided inside the variable resistance layer 30 (a second cell) in the second state F2. A second region 32b2 is provided on the upper surface of the fourth region 32d2. The second region 32b2 contacts the lower surface of the second electrode 23. A third region 32c2 is provided in a region other than the region where the fourth region 32d2 and the second region 32b2 are provided.

The concentration of the chemical element 35 in the fourth region 32d2 is higher than the concentration in the second region 32b2 and the third region 32c2 and lower than the concentration in the first region 32a1 in the first state F1. For example, the concentration of the chemical element 35 in the first region 32a1 is not less than 10 times the concentration in the fourth region 32d2. The concentration of the chemical element 35 in the third region 32c2 is not less than the concentration in the second region 32b2.

In other words, the concentration of the chemical element 35 in the regions 32a1, 32d2, 32b2, and 32c2 is expressed using inequality signs in Formula (2).

$$\text{first region } 32a1 > \text{fourth region } 32d2 > \text{third region } 32c2 \geq \text{second region } 32b2 \qquad (2)$$

Also, the concentration of the chemical element 35 in the second region 32b2 in the second state F2 is about the same as the concentration in the second region 32b1 in the first state F1. In other words, the concentration gradient between the fourth region 32d2 and the second region 32b2 in the second state F2 is smaller than the concentration gradient between the first region 32a1 and the second region 32b1 in the first state F1. The volume of the fourth region 32d2 in the second state F2 is, for example, not less than the volume of the first region 32a1 in the first state F1.

The method for forming the second state F2 is, for example, as follows. A more detailed description is recited below as the operation method. Similarly to the method for forming the first state F1 described above, the concentration gradient of the chemical element 35 occurs inside the variable resistance layer 30 when the voltage is applied between the first electrode 22 and the second electrode 23. At this time, compared to the first state F1, the chemical element 35 is affected by the Joule heat generated in the first electrode 22. Therefore, the diffusion of the chemical element 35 of the first electrode 22 upper portion is promoted. Thereby, the fourth region 32d2, the second region 32b2, and the third region 32c2 are provided inside the variable resistance layer 30; and the second state F2 is formed.

That is, the first region 32a1 which has high resistance is not provided on a line linking the first electrode 22 and the second electrode 23 inside the variable resistance layer 30. In other words, the first region 32a1 which has the high resistance is not provided in the current path between the first electrode 22 and the second electrode 23. Thereby, the resistance of the variable resistance layer 30 in the second state F2 is lower than the resistance of the variable resistance layer 30 in the first state F1.

The first electrode 22 may be provided on a portion of the lower surface of the variable resistance layer 30; and the second electrode 23 may be provided on substantially the upper surface of the variable resistance layer 30.

(Method for Manufacturing First Embodiment)

A method for manufacturing a memory device of the embodiment will now be described with reference to FIG. 3A to FIG. 3C. The manufacturing method relating to the configuration under the electrode layer 21 is not shown.

Figure 3A:
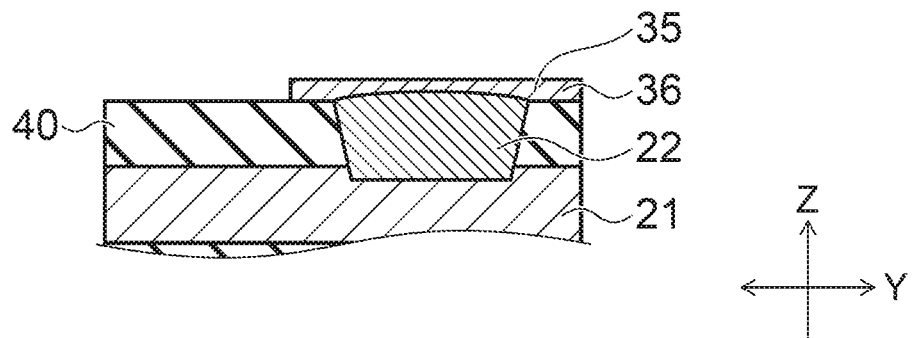
FIGS. 3A to 3C are schematic cross-sectional views showing a method for manufacturing the memory device of the first embodiment.

As shown in FIG. 3A, the first electrode 22 is formed on the electrode layer 21. For example, the insulating film 40 that has a hole is formed on the upper surface of the electrode layer 21; and the first electrode 22 is formed by filling a metal material inside the hole. The diameter of the first electrode 22 is, for example, 100 nm. The first electrode 22 includes, for example, at least one of titanium, tantalum, or tungsten and may be a metal nitride of these components. In the first electrode 22, for example, an insulating film may be formed inside the metal film.

A first layer 36 that includes the chemical element 35 is formed on the first electrode 22. For example, one of sputtering, CVD (chemical vapor deposition), physical vapor deposition, or the like is used as the method for forming the first layer 36. The chemical element 35 includes, for example, at least one of germanium, silicon, or carbon.

Figure 3B:
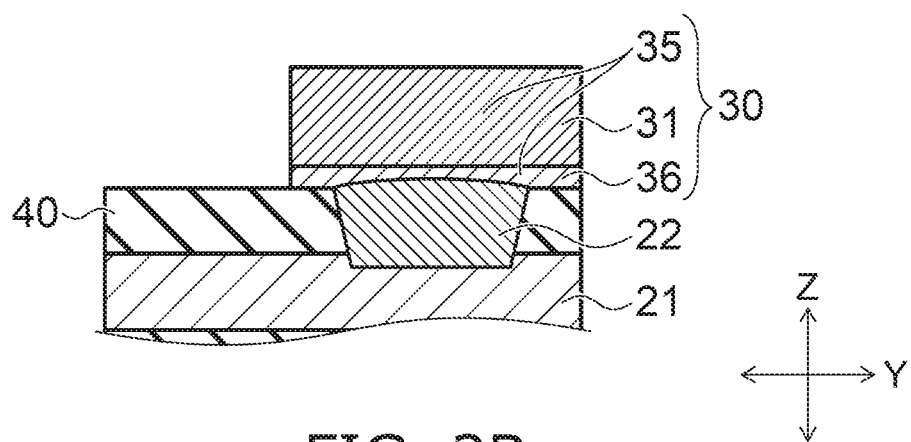

As shown in FIG. 3B, the chalcogenide compound 31 is formed on the first layer 36; and the variable resistance layer 30 is formed. For example, one of sputtering, CVD, physical vapor deposition, or the like is used as the method for forming the chalcogenide compound 31.

When forming the chalcogenide compound 31, for example, the formation is performed in a heated state at 200° C. or more. For example, the heating may be performed after the chalcogenide compound 31 is formed. The crystal defects of the chalcogenide compound 31 are reduced by performing the heating. Further, the chemical element 35 diffuses inside the chalcogenide compound 31 and forms a low-defect solid solution state. The chalcogenide compound 31 has, for example, the c-axis orientation.

The chalcogenide compound 31 includes a compound of at least one type of chemical element selected from the first group and the second group described above and at least one type of chemical element selected from the third group described above.

For example, the chalcogenide compound 31 may be formed on the first electrode 22; and the first layer 36 may be formed on the chalcogenide compound 31.

Figure 3C:
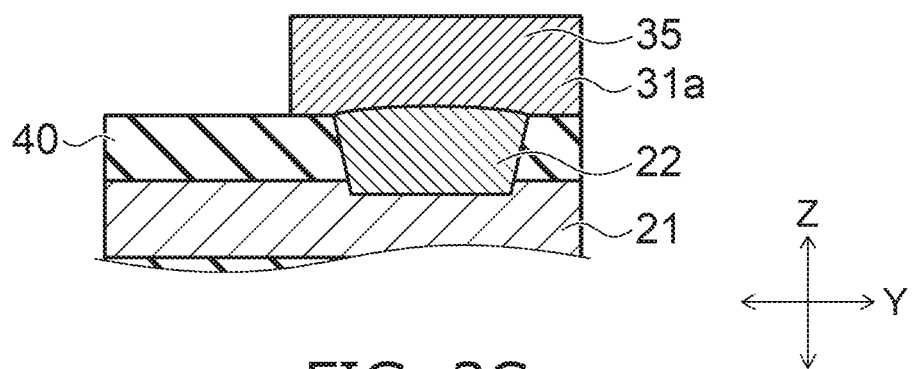

For example, as shown in FIG. 3C, an alloy layer 31a may be formed on the first electrode 22 instead of the first layer 36. The alloy layer 31a includes, for example, a chalcogenide compound including the first group described above.

By applying a direct current voltage or a pulse voltage to the alloy layer 31a, the chalcogenide compound 31 described above in which the chemical element 35 is diffused is formed; and the variable resistance layer 30 is formed. The alloy layer 31a does not melt when the direct current voltage or the pulse voltage described above is applied to the alloy layer 31a.

For example, the alloy layer 31a may be a stacked body including multiple materials (e.g., a stacked body having a superlattice structure). In such a case, the alloy layer 31a includes the material of the chalcogenide compound 31 described above.

As shown in FIG. 1B, FIG. 2A, and FIG. 2B, the second electrode 23 is formed on the variable resistance layer 30. Similarly to the first electrode 22, the second electrode 23 may include, for example, at least one of titanium, tantalum, or tungsten and may be a metal nitride of these components. As the second electrode 23, for example, an insulating film may be formed inside the metal film.

Subsequently, the insulating film 40, the contact 24, the first interconnect layer 25, etc., are formed; and the memory device of the embodiment is formed.

(Operation Method Relating to Variable Resistance Layer 30)

An example of the operation method for changing the states of the variable resistance layer 30 will now be described with reference to FIG. 4A to FIG. 6C. In the embodiment and hereinbelow, the voltage value is the voltage value of the second electrode 23 when the first electrode 22 is set to a reference (0 V).

Figure 4A:
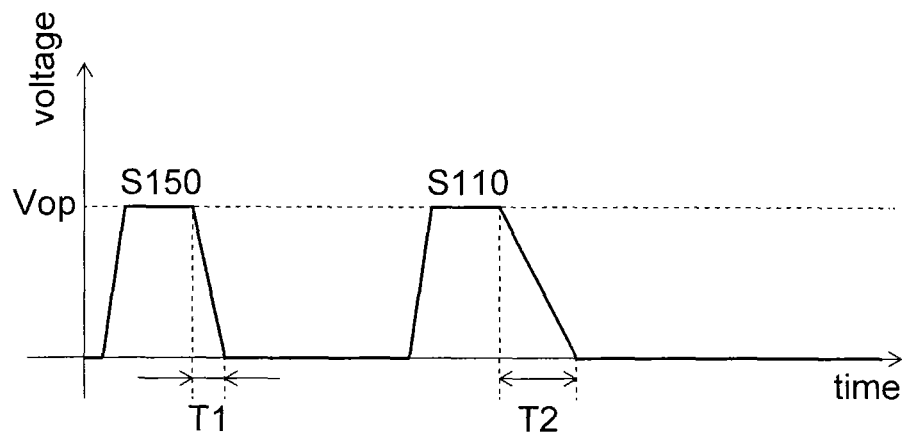
FIG. 4A and FIG. 4B are graphs showing the relationship between time and the voltage value applied to the variable resistance layer.
Figure 4B:
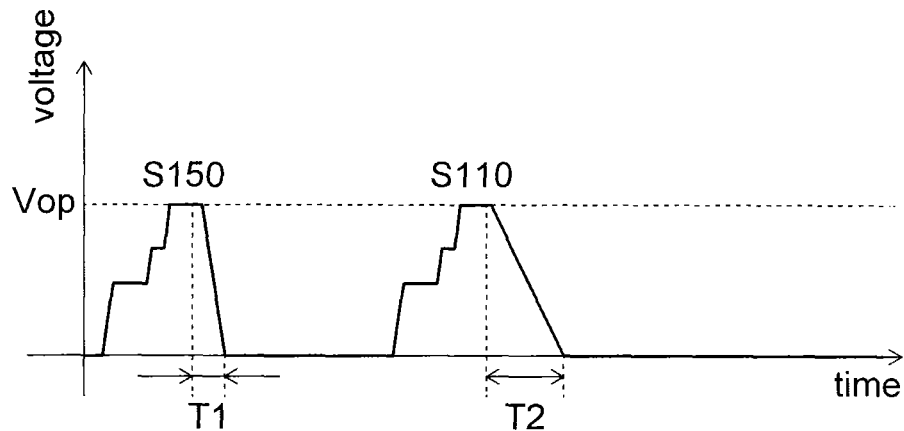
Figure 4C:
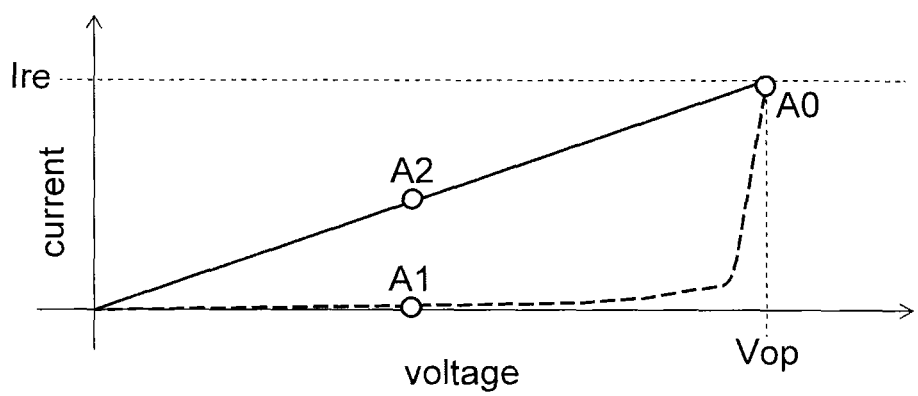
FIG. 4C is a graph showing the relationship between the current value and the voltage value applied to the variable resistance layer.

A first operation method will now be described with reference to FIG. 4A to FIG. 4C. FIG. 4A and FIG. 4B are graphs showing the relationship between time and the voltage value applied to the variable resistance layer 30. FIG. 4C is a graph showing the relationship between the current value and the voltage value applied to the variable resistance layer 30.

The relationship between time and the voltage for each operation will now be described with reference to FIG. 4A and FIG. 4B.

The reset operation S150 will now be described. As shown in FIG. 4A, the reset operation S150 is the operation of ramping-down the applied voltage in a ramp-down time T1 (the time from the maximum voltage value of the pulse voltage to the voltage removal) after a voltage Vop is applied between the first electrode 22 and the second electrode 23. By this operation, the variable resistance layer 30 is switched to the first state F1 and is in the high resistance state.

When the voltage Vop is applied between the first electrode 22 and the second electrode 23, the chemical element 35 drifts inside the variable resistance layer 30 and coalesces on the low voltage (the low potential) electrode side. Joule heat is generated by the current flowing in the electrode; and the drifting of the chemical element 35 is accelerated. It is sufficient for the temperature to which the variable resistance layer 30 is heated by the Joule heat to be a temperature at which the crystal does not melt, e.g., 400° C. or less.

Figure 9A:
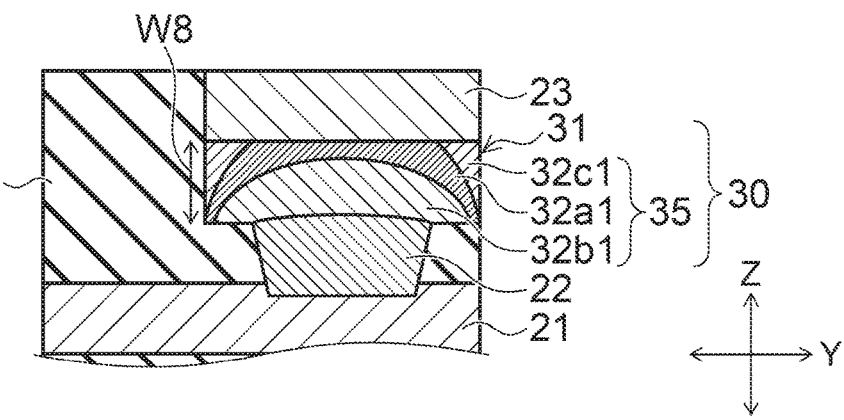
FIGS. 9A to 9D are schematic cross-sectional views of a variable resistance layer of the first embodiment.

Subsequently, in the case where the applied voltage becomes 0 V in a sufficiently short ramp-down time, the variable resistance layer 30 is cooled (quenched) in a short period of time; and the first state F1 is formed. For example, in the case where the potential of the first electrode 22 is higher than the potential of the second electrode 23, the first region 32a1 in the first state F1 may not contact the upper surface of the first electrode 22 as shown in FIG. 9A described below. In such a case, the first region 32a1 covers the upper surface of the first electrode 22. The second region 32b1 is provided between the first region 32a1 and the first electrode 22 and covers the upper surface of the first electrode 22.

The set operation S110 will now be described. As shown in FIG. 4A, the set operation S110 is an operation of ramping-down the applied voltage in a ramp-down time T2 after the voltage Vop is applied between the first electrode 22 and the second electrode 23. By this operation, the variable resistance layer 30 is switched to the second state F2 and is in the low resistance state.

In the case where the applied voltage becomes 0 V in a sufficiently long ramp-down time after the voltage Vop is applied between the first electrode 22 and the second electrode 23, the variable resistance layer 30 is cooled over time (slowly cooled); and the second state F2 is formed. The pulse ramp-down time T2 of the set operation S110 is longer than the pulse ramp-down time T1 of the reset operation S150.

The value of the voltage Vop described above is not more than a value at which the crystal structure of the chalcogenide compound 31 does not change when repeatedly implementing the set operation S110 and the reset operation S150.

Typically, the pulse width (the voltage input time) when applying the voltage Vop is 50 ns or more. However, according to the film thickness and/or material of the variable resistance layer 30, the pulse width may be less than 50 ns. It is sufficient for the pulse width to be able to increase the voltage to a sufficient voltage; and in the case of a short pulse width, the pulse width may be set to be longer due to concerns of not increasing to the prescribed voltage due to the interconnect delay, etc.

Also, although the pulse ramp-up time is, for example, 10 ns or less, the pulse ramp-up time may be 10 ns or more and is arbitrary. The pulse ramp-down time T1 of the reset operation S150 is, for example, 10 ns or less and may be less than 100 ns. The pulse ramp-down time T2 of the set operation S110 is, for example, 100 ns or more.

For example, as shown in FIG. 4B, the ramp-up of the pulse may ramp-up in steps and may ramp-down in steps. In such a case, the ramp-down times of the voltage Vop are the same as the pulse ramp-down times T1 and T2 described above. Because the pulses of the operations described below are similar, a description is omitted.

The relationship between the voltage and the current for the operation S110 and S150 will now be described with reference to FIG. 4C.

The reset operation S150 will now be described. As shown in FIG. 4C, a current Ire is supplied when the voltage Vop is applied between the first electrode 22 and the second electrode 23 (point A0). Subsequently, the voltage Vop is changed to 0 V via point A1. At this time, the variable resistance layer 30 forms the first state F1.

The set operation S110 will now be described. As shown in FIG. 4C, the current Ire is supplied when the voltage Vop is applied between the first electrode 22 and the second electrode 23 (point A0). Subsequently, the voltage Vop is changed to 0 V via point A2. At this time, the variable resistance layer 30 forms the second state F2.

(Second Operation Method)

A second operation method will now be described using FIG. 5A to FIG. 5D. In the case of the operation method, the voltages that are used in the set operation S110 and the reset operation S150 are different from each other. A description is omitted for the portions that are the same as the operation method described above.

Figure 5A:
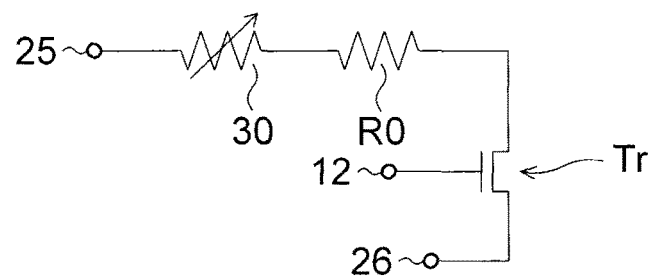
FIG. 5A is a circuit diagram of the memory device of the first embodiment.
Figure 5B:
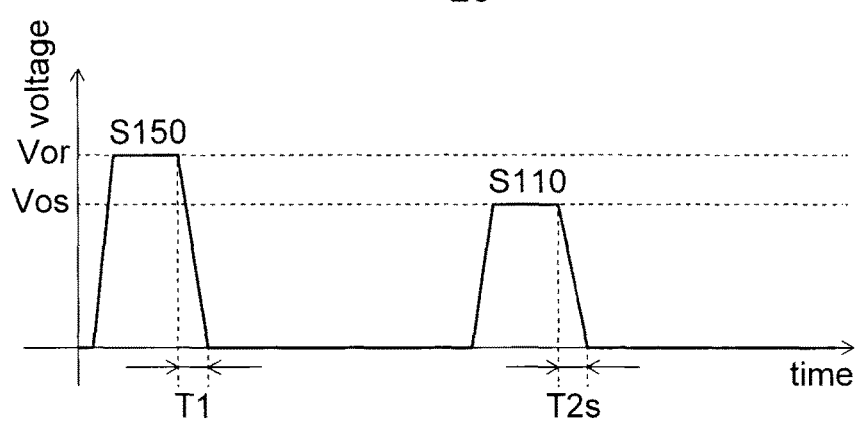
FIG. 5B is a graph showing the relationship between time and the voltage value applied to the variable resistance layer.
Figure 5C:
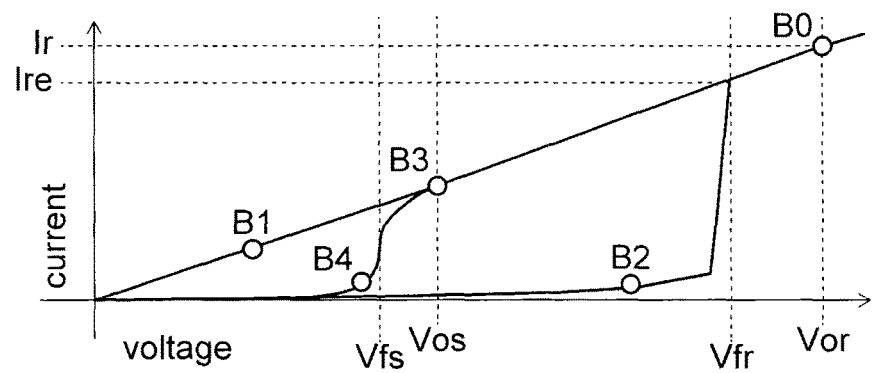
FIG. 5C and FIG. 5D are graphs showing the relationship between the current value and the voltage value applied to the variable resistance layer.
Figure 5D:
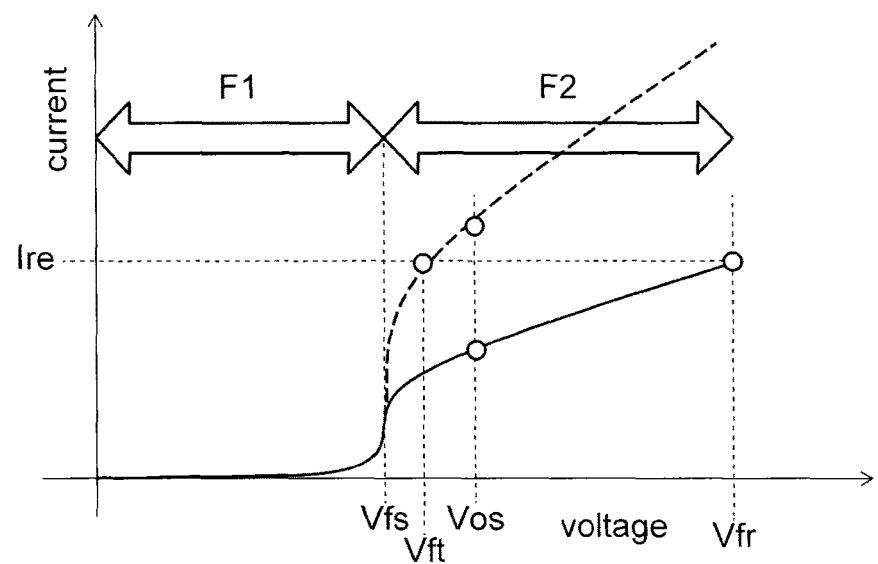

FIG. 5A is a circuit diagram of the memory device 1 of the embodiment; FIG. 5B is a graph showing the relationship between time and the voltage value applied to the variable resistance layer 30; and FIG. 5C and FIG. 5D are graphs showing the relationship between the current value and the voltage value applied to the variable resistance layer 30.

The circuit diagram of the memory device 1 of the operation method will now be described with reference to FIG. 5A.

As shown in FIG. 5A, a resistor R0 is provided between the variable resistance layer 30 and the transistor Tr. The resistance of the resistor R0 is lower than the resistance of the first state F1 of the variable resistance layer 30. For example, the resistance value of the resistor R0 is on the order of the resistance value of the first state F1 or less. The resistance of the resistor R0 is about the same as or less than the resistance of the second state F2 of the variable resistance layer 30.

The relationship between time and the voltage for the operations S110 and S150 will now be described with reference to FIG. 5B.

The reset operation S150 will now be described. As shown in FIG. 5B, the reset operation S150 ramps-down the applied voltage in the ramp-down time T1 after a voltage Vor is applied between the first electrode 22 and the second electrode 23.

The set operation S110 will now be described. As shown in FIG. 5B, the set operation S110 ramps-down the applied voltage in the ramp-down time T2s after a voltage Vos is applied between the first electrode 22 and the second electrode 23. The voltage Vos that is used in the set operation S110 is lower than the voltage Vor used in the reset operation S150. Also, the pulse ramp-down time T2s of the set operation S110 is, for example, the same as the pulse ramp-down time T1 of the reset operation S150 and may be, for example, 100 ns or less.

The relationship between the voltage and the current for the operations S110 and S150 will now be described with reference to FIG. 5C. A voltage Vfr is the minimum applied voltage used in the reset operation S150; and a voltage Vfs is the minimum applied voltage of the set operation S110. The operations S110 and S150 change the state of the variable resistance layer 30 by using voltages that are not less than the minimum applied voltages Vfs and Vfr.

The reset operation S150 will now be described. As shown in FIG. 5C, a current Ir is supplied when the voltage Vor is applied between the first electrode 22 and the second electrode 23 (point B0). At this time, the voltage Vor is applied via points B1 and B3. Subsequently, the voltage Vor is changed to 0 V via point B2. Thereby, the variable resistance layer 30 forms the first state F1. In other words, in the reset operation S150, the state of the variable resistance layer 30 is changed by supplying the current Ir that is not less than the current Ire.

The set operation S110 will now be described. As shown in FIG. 5C, when the variable resistance layer 30 is taken to be in the first state F1, the voltage Vos is applied between the first electrode 22 and the second electrode 23 via point B4 (point B3). The voltage Vos is lower than the voltage Vor. Subsequently, the voltage Vos is changed to 0 V via point B1. Thereby, the variable resistance layer 30 forms the second state F2. In other words, in the set operation S110, the state of the variable resistance layer 30 is changed by using the voltage Vos that is not less than the minimum applied voltage Vfs.

The relationship between the voltage and the current in the case where the resistor R0 is provided will now be described with reference to FIG. 5D. The dashed line of FIG. 5D illustrates the relationship between the voltage and the current in the case where the resistor R0 is not provided; and the solid line of FIG. 5D illustrates the relationship between the voltage and the current in the case where the resistor R0 is provided. A voltage Vft is the minimum applied voltage of the reset operation S150 in the case where the resistor R0 is not provided.

As shown in FIG. 5D, the current Ire is supplied when the minimum applied voltage Vft is applied between the first electrode 22 and the second electrode 23. The minimum applied voltage Vft is lower than the voltage Vos. Conversely, the minimum applied voltage Vfr in the case where the resistor R0 is used is higher than the voltage Vos. In other words, the minimum applied voltage of the reset operation S150 is higher.

Here, as described above, the resistance of the resistor R0 is lower than the resistance of the first state F1 of the variable resistance layer 30. Thereby, in the first state F1, the effect of the voltage drop due to the resistor R0 is small. Therefore, the minimum applied voltage Vfs of the set operation S110 of changing from the first state F1 to the second state F2 substantially does not change regardless of the existence or absence of the resistor R0.

Conversely, the resistance of the resistor R0 is about the same as or less than the resistance of the second state F2 of the variable resistance layer 30. That is, the effect of the voltage drop due to the resistor R0 is larger in the second state F2 than in the first state F1. Therefore, in the reset operation S150 of changing from the second state F2 to the first state F1, the supply amount of the current for the applied voltage decreases because the resistor R0 is disposed. Thereby, the minimum applied voltage that can supply the current Ire necessary for the state change of the variable resistance layer 30 changes to the voltage Vfr which is higher than the voltage Vft.

Due to the description recited above, by providing the resistor R0, the voltage Vor that is used in the reset operation S150 is higher than the voltage Vos used in the set operation S110.

(Third Operation Method)

A third operation method will now be described using FIG. 6A to FIG. 6C. In the case of the operation method, a negative voltage −Vt is used in the reset operation S150; and a positive voltage Vt is used in the set operation S110. A description is omitted for the portions that are the same as those of the operation methods described above.

Figure 6A:
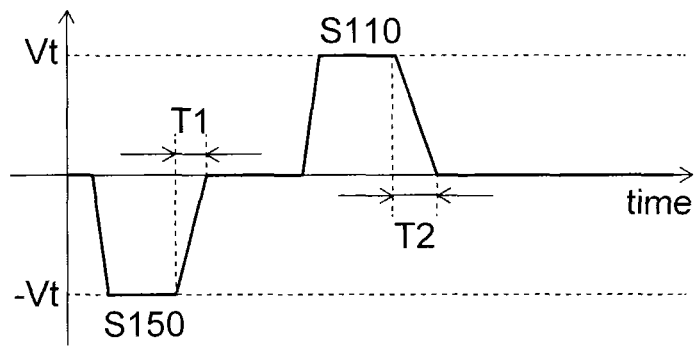
FIG. 6A and FIG. 6B are graphs showing the relationship between time and the voltage value applied to the variable resistance layer.
Figure 6B:
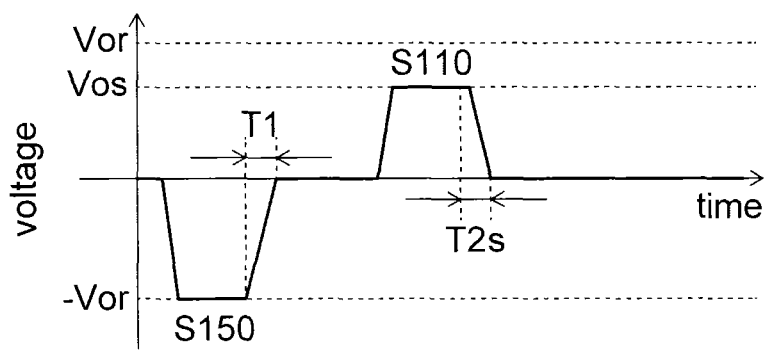
Figure 6C:
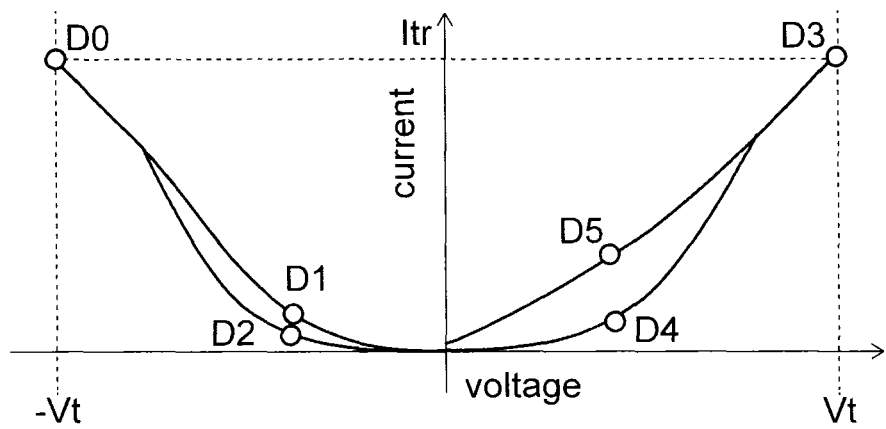
FIG. 6C is a graph showing the relationship between the current value and the voltage value applied to the variable resistance layer.

FIG. 6A and FIG. 6B are graphs showing the relationship between time and the voltage value applied to the variable resistance layer 30; and FIG. 6C is a graph showing the relationship between the current value and the voltage value applied to the variable resistance layer 30.

The reset operation S150 will now be described. As shown in FIG. 6A, the reset operation S150 ramps-down the voltage application in the ramp-down time T1 after the negative voltage −Vt is applied between the first electrode 22 and the second electrode 23.

The set operation S110 will now be described. As shown in FIG. 6A, the set operation S110 ramps-down the voltage application in the ramp-down time T2 after the positive voltage Vt is applied between the first electrode 22 and the second electrode 23. Similarly to the operation method described above, the ramp-down time T2 is longer than the ramp-down time T1 of the reset operation S150.

For example, as shown in FIG. 6B, the set operation S110 may be performed to match the second operation method described above. Namely, the reset operation S150 uses a voltage −Vor; and the set operation S110 uses the voltage Vos that is lower than the voltage Vor. At this time, it is possible to shorten the pulse ramp-down time T2s of the set operation S110 to be, for example, 100 ns or less.

The relationship between the voltage and the current for the operations S110 and S150 will now be described with reference to FIG. 6C.

The reset operation S150 will now be described. As shown in FIG. 6C, a current Itr is supplied when the voltage −Vt is applied between the first electrode 22 and the second electrode 23 (point D0). At this time, the voltage is applied via point D1.

Subsequently, the voltage −Vt is changed to 0 V via point D2. At this time, the variable resistance layer 30 forms the first state F1.

The set operation S110 will now be described. As shown in FIG. 6C, the current Itr is supplied when the voltage Vt is applied between the first electrode 22 and the second electrode 23 (point D3). At this time, the voltage is applied via point D4.

Subsequently, the voltage Vt is changed to 0 V via point D5. At this time, the variable resistance layer 30 forms the second state F2.

(Modification of Variable Resistance Layer 30)

Other examples of the state of the variable resistance layer 30 will now be described with reference to FIG. 7A to FIG. 10E.

Examples of the variable resistance layer 30 in the first state F1 will now be described with reference to FIG. 7A and FIG. 7B.

Figure 7A:
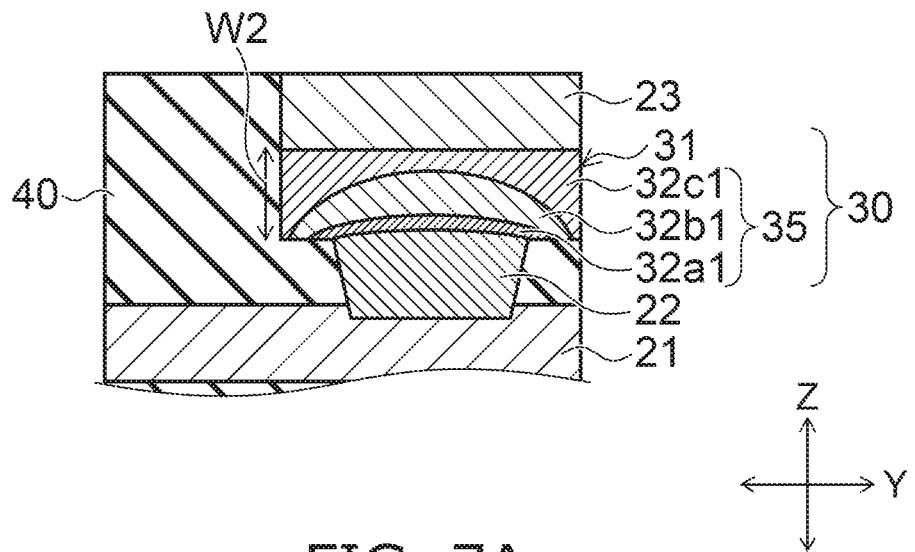
FIG. 7A and FIG. 7B are schematic cross-sectional views of a variable resistance layer of the first embodiment.

As shown in FIG. 7A, unlike FIG. 2A, the second region 32$b$1 is separated from the lower surface of the second electrode 23 inside the variable resistance layer 30. The third region 32$c$1 covers the upper surface of the second region 32$b$1. The third region 32$c$1 covers the lower surface of the second electrode 23.

For example, a thickness W2 in the Z-direction of the variable resistance layer 30 is thicker than the thickness W1 shown in FIG. 2A. For example, the amount of the chemical element 35 included inside the variable resistance layer 30 is more than the amount of the chemical element 35 included inside the variable resistance layer 30 shown in FIG. 2A.

Figure 7B:
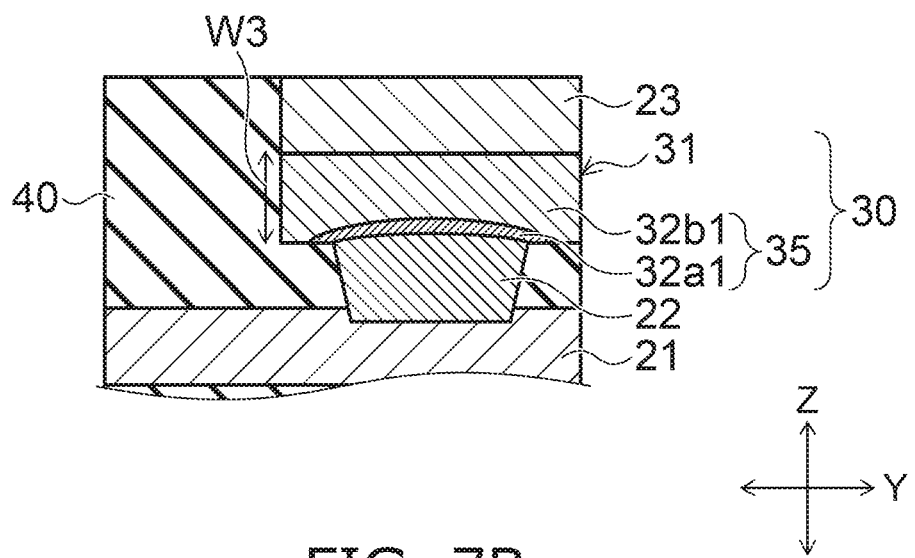

As shown in FIG. 7B, unlike FIG. 2A, the second region 32$b$1 is provided in the region inside the variable resistance layer 30 other than the region where the first region 32$a$1 is provided. The second region 32$b$1 covers the lower surface of the second electrode 23.

For example, a thickness W3 in the Z-direction of the variable resistance layer 30 is thinner than the thickness W1 shown in FIG. 2A. For example, the amount of the chemical element 35 included inside the variable resistance layer 30 is less than the amount of the chemical element 35 included inside the variable resistance layer 30 shown in FIG. 2A.

The variable resistance layer 30 in the second state F2 will now be described with reference to FIG. 8A to FIG. 8D.

Figure 8A:
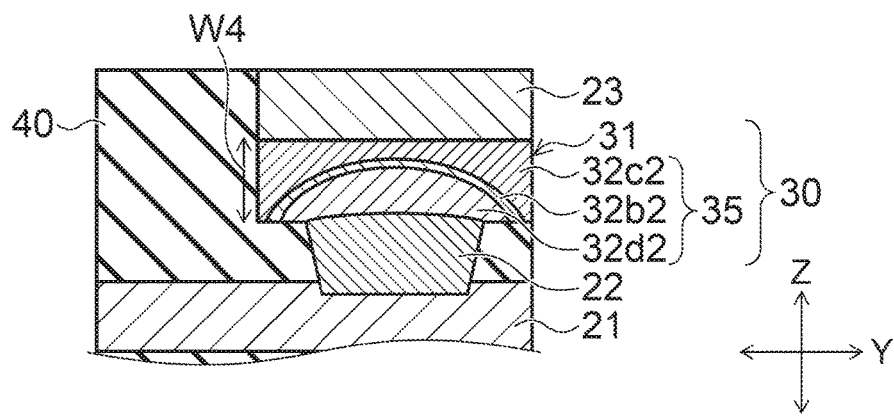
FIGS. 8A to 8D are schematic cross-sectional views of a variable resistance layer of the first embodiment.

As shown in FIG. 8A, unlike FIG. 2B, the second region 32$b$2 is separated from the lower surface of the second electrode 23 inside the variable resistance layer 30. The third region 32$c$2 covers the upper surface of the second region 32$b$2. The third region 32$c$2 covers the lower surface of the second electrode 23.

For example, a thickness W4 in the Z-direction of the variable resistance layer 30 is thicker than the thickness W1 shown in FIG. 2B. For example, the amount of the chemical element 35 included inside the variable resistance layer 30 is more than the amount of the chemical element 35 included inside the variable resistance layer 30 shown in FIG. 2B.

Figure 8B:
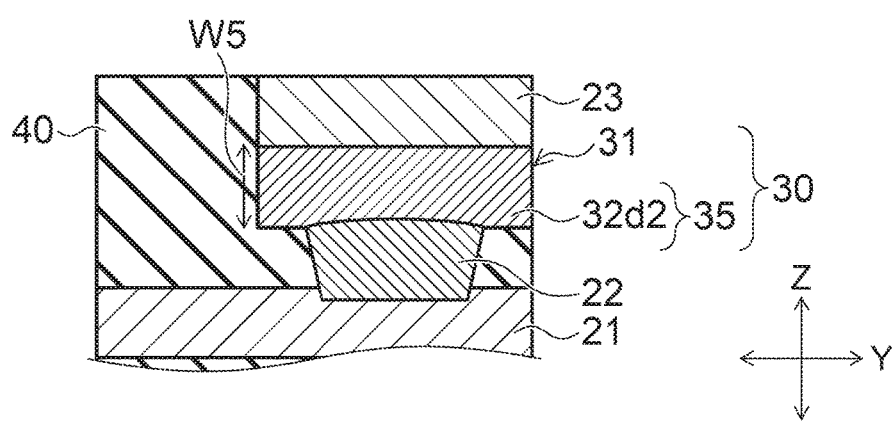

As shown in FIG. 8B, unlike FIG. 2B, the fourth region 32$d$2 covers the upper surface of the first electrode 22 and the lower surface of the second electrode 23 and is provided to be continuous in the Z-direction inside the variable resistance layer 30. The fourth region 32$d$2 contacts the upper surface of the first electrode 22 and the lower surface of the second electrode 23.

For example, a thickness W5 of the variable resistance layer 30 is thinner than the thickness W1 shown in FIG. 2B. For example, the amount of the chemical element 35 included inside the variable resistance layer 30 is less than the amount of the chemical element 35 included inside the variable resistance layer 30 shown in FIG. 2B.

Figure 8C:
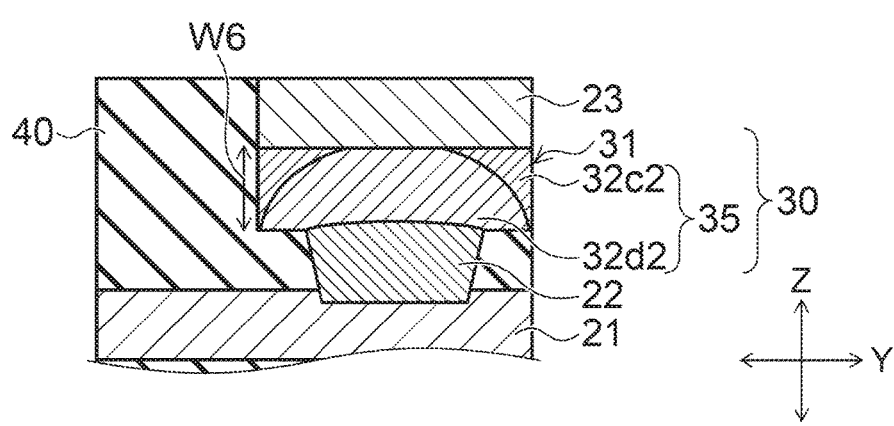

As shown in FIG. 8C, unlike FIG. 2B, the fourth region 32$d$2 contacts the lower surface of the second electrode 23 inside the variable resistance layer 30. The third region 32$c$2 contacts the upper surface of the fourth region 32$d$2 and the lower surface of the second electrode 23.

For example, the amount of the chemical element 35 included inside the variable resistance layer 30 is more than the amount of the chemical element 35 included inside the variable resistance layer 30 shown in FIG. 2B.

Figure 8D:
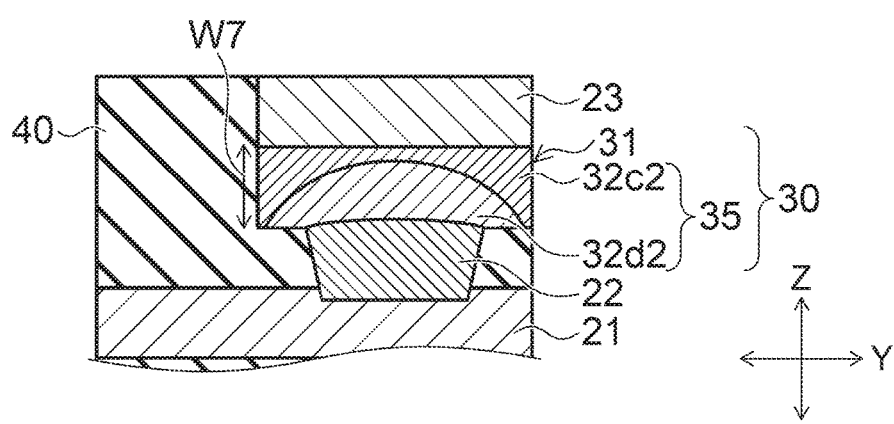

As shown in FIG. 8D, unlike FIG. 2B, the third region 32$c$2 covers the upper surface of the fourth region 32$d$2 inside the variable resistance layer 30. The third region 32$c$2 covers the lower surface of the second electrode 23.

For example, a thickness W7 of the variable resistance layer 30 is thicker than the thickness W1 shown in FIG. 2B. For example, the amount of the chemical element 35 included inside the variable resistance layer 30 is more than the amount of the chemical element 35 included inside the variable resistance layer 30 shown in FIG. 2B.

Examples of the variable resistance layer 30 when the potential of the first electrode 22 is higher than the potential of the second electrode 23 will now be described with reference to FIG. 9A to FIG. 10E.

When the potential of the first electrode 22 is higher than the potential of the second electrode 23, the chemical element 35 collects on the second electrode 23 side. In FIG. 9A to FIG. 10E, the current density is higher in the first electrode 22 than in the second electrode 23; and the first electrode 22 upper portion is heated by Joule heat. Thereby, the diffusion of the chemical element 35 of the second electrode 23 lower portion which is at a low temperature is delayed. Therefore, the change of the concentration gradient of the chemical element 35 is small. On the other hand, the diffusion of the chemical element 35 of the first electrode 22 upper portion is accelerated. Therefore, the change of the concentration gradient of the chemical element 35 is large.

Examples of the variable resistance layer 30 in the first state F1 will now be described with reference to FIG. 9A to FIG. 9D.

As shown in FIG. 9A, the first region 32a1 covers the upper surface of the first electrode 22. The first region 32a1 contacts the lower surface of the second electrode 23. The second region 32b1 is provided between the first region 32a1 and the first electrode 22 and covers the upper surface of the first electrode 22. The third region 32c1 is provided in the region other than the region where the first region 32a1 and the second region 32b1 are provided. The third region 32c1 contacts the lower surface of the second electrode 23.

Figure 9B:
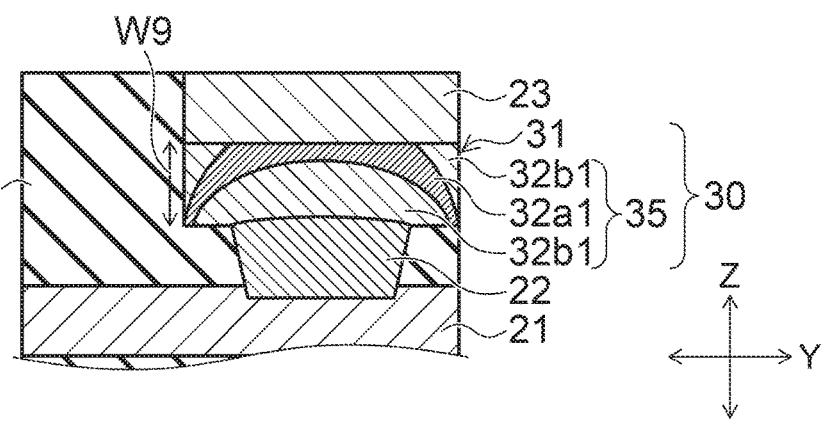

As shown in FIG. 9B, unlike FIG. 9A, the second region 32b1 is provided around the first region 32a1 inside the variable resistance layer 30. The second region 32b1 contacts the lower surface of the second electrode 23 and the first region 32a1.

For example, a thickness W9 in the Z-direction of the variable resistance layer 30 is thinner than a thickness W8 shown in FIG. 9A. For example, the amount of the chemical element 35 included inside the variable resistance layer 30 is less than the amount of the chemical element 35 included inside the variable resistance layer 30 shown in FIG. 9A.

Figure 9C:
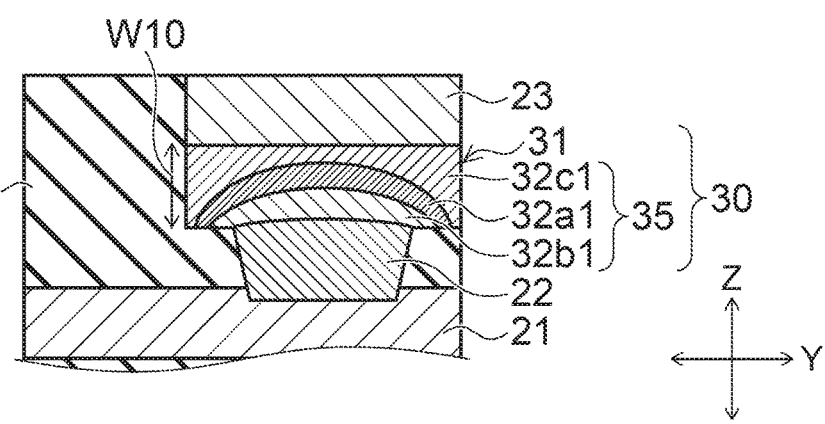

As shown in FIG. 9C, unlike FIG. 9A, the first region 32a1 is separated from the second electrode 23 inside the variable resistance layer 30. The third region 32c1 covers the first region 32a1. The third region 32c1 covers the lower surface of the second electrode 23.

For example, a thickness W10 in the Z-direction of the variable resistance layer 30 is thicker than the thickness W8 shown in FIG. 9A. For example, the amount of the chemical element 35 included inside the variable resistance layer 30 is more than the amount of the chemical element 35 included inside the variable resistance layer 30 shown in FIG. 9A.

Figure 9D:
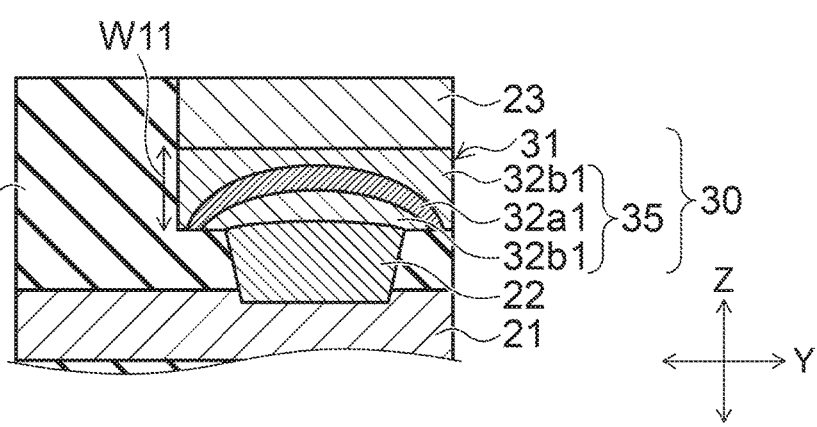

As shown in FIG. 9D, unlike FIG. 9A, the first region 32a1 is separated from the second electrode 23 inside the variable resistance layer 30. The second region 32b1 covers the first region 32a1.

For example, a thickness W11 in the Z-direction of the variable resistance layer 30 is thicker than the thickness W8 shown in FIG. 9A. For example, the amount of the chemical element 35 included inside the variable resistance layer 30 is less than the amount of the chemical element 35 included inside the variable resistance layer 30 shown in FIG. 9A.

In FIG. 9A to FIG. 9D as well, similarly to the variable resistance layer 30 in the first state F1 shown in FIG. 2A, the first region 32a1 is provided on a line linking the first electrode 22 and the second electrode 23 inside the variable resistance layer 30. In other words, the first region 32a1 is provided in the current path between the first electrode 22 and the second electrode 23. Thereby, the resistance of the variable resistance layer 30 in the first state F1 becomes high.

Examples of the variable resistance layer 30 in the second state F2 will now be described with reference to FIG. 10A to FIG. 10E.

Figure 10A:
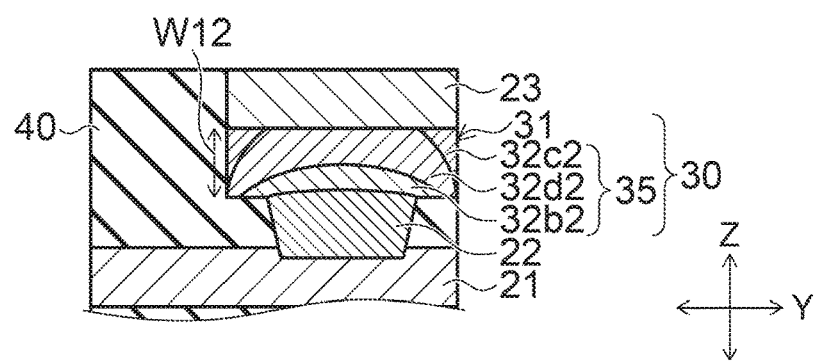
FIGS. 10A to 10E are schematic cross-sectional views of a variable resistance layer of the first embodiment.

As shown in FIG. 10A, the fourth region 32d2 covers the upper surface of the first electrode 22. The fourth region 32d2 contacts the lower surface of the second electrode 23. The second region 32b2 is provided between the fourth region 32d2 and the first electrode 22 and covers the upper surface of the first electrode 22. The third region 32c2 is provided in the region other than the region where the fourth region 32d2 and the second region 32b2 are provided.

Figure 10B:
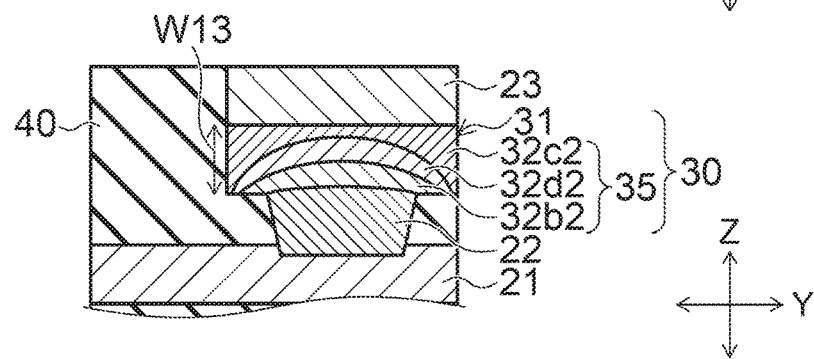

As shown in FIG. 10B, unlike FIG. 10A, the fourth region 32d2 is separated from the second electrode 23 inside the variable resistance layer 30. The third region 32c2 covers the upper surface of the fourth region 32d2. The third region 32c2 covers the lower surface of the second electrode 23.

For example, a thickness W13 in the Z-direction of the variable resistance layer 30 is thicker than a thickness W12 shown in FIG. 10A. For example, the amount of the chemical element 35 included inside the variable resistance layer 30 is more than the amount of the chemical element 35 included inside the variable resistance layer 30 shown in FIG. 10A.

Figure 10C:
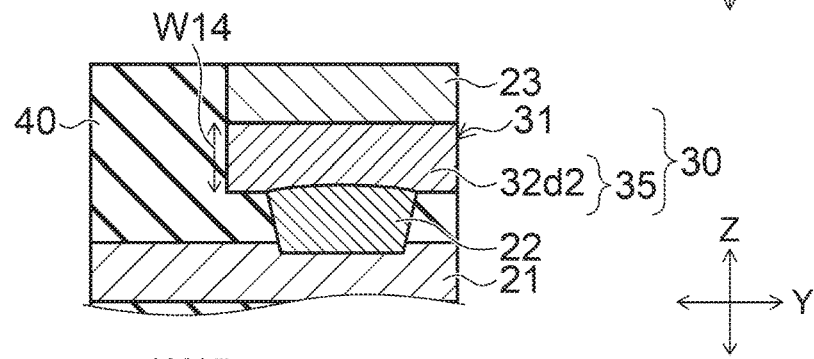

As shown in FIG. 10C, unlike FIG. 10A, the fourth region 32d2 covers the upper surface of the first electrode 22 and the lower surface of the second electrode 23 and is provided to be continuous in the Z-direction inside the variable resistance layer 30. The fourth region 32d2 contacts the upper surface of the first electrode 22 and the lower surface of the second electrode 23.

For example, a thickness W14 in the Z-direction of the variable resistance layer 30 is thinner than the thickness W12 shown in FIG. 10A. For example, the amount of the chemical element 35 included inside the variable resistance layer 30 is more than the amount of the chemical element 35 included inside the variable resistance layer 30 shown in FIG. 10A.

Figure 10D:
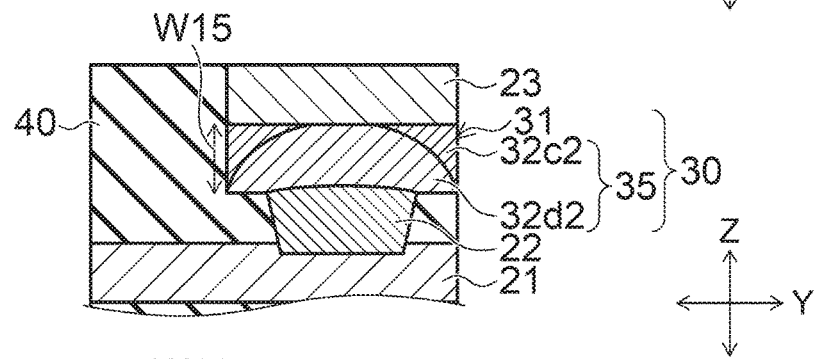

As shown in FIG. 10D, unlike FIG. 10A, the fourth region 32d2 contacts the upper surface of the first electrode 23 and the lower surface of the second electrode 23 inside the variable resistance layer 30. The third region 32c2 contacts the lower surface of the second electrode 23 and the fourth region 32d2.

For example, the amount of the chemical element 35 included inside the variable resistance layer 30 is more than the amount of the chemical element 35 included inside the variable resistance layer 30 shown in FIG. 10A.

Figure 10E:
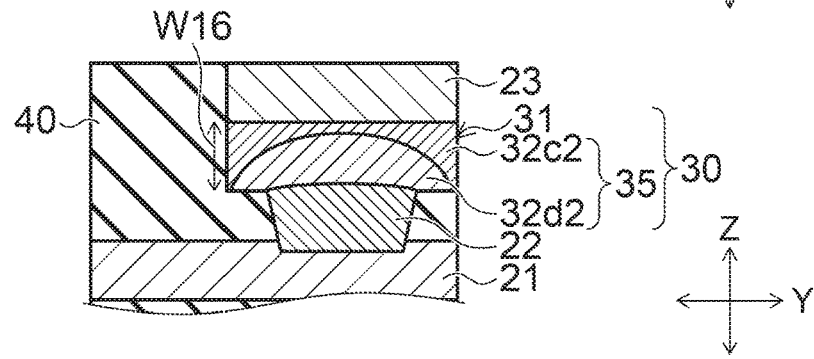

As shown in FIG. 10E, unlike FIG. 10A, the fourth region 32d2 is separated from the second electrode 23 inside the variable resistance layer 30. The fourth region 32d2 contacts the upper surface of the first electrode 23. The third region 32c2 covers the upper surface of the fourth region 32d2. The third region 32c2 covers the lower surface of the second electrode 23.

For example, a thickness W16 in the Z-direction of the variable resistance layer 30 is thicker than the thickness W12 shown in FIG. 10A. For example, the amount of the chemical element 35 included inside the variable resistance layer 30 is more than the amount of the chemical element 35 included inside the variable resistance layer 30 shown in FIG. 10A.

In FIG. 10A to FIG. 10E as well, similarly to the variable resistance layer 30 of the second state F2 shown in FIG. 2B, the first region 32a1 which has high resistance is not provided on a line linking the first electrode 22 and the second electrode 23 inside the variable resistance layer 30. In other words, the first region 32a1 which has high resistance is not provided in the current path between the first electrode 22 and the second electrode 23. Thereby, the resistance of the variable resistance layer 30 in the second state F2 is lower than the resistance of the variable resistance layer 30 in the first state F1.

The concentration of the chemical element 35 for the regions 32a1 to 32d2 described above is not necessarily constant inside the regions and has some fluctuation. For example, the range of the fluctuation is within a range that satisfies the conditions of Formula (1) and Formula (2) described above.

Effects of the embodiment will now be described.

According to the embodiment, the variable resistance layer 30 has the first state F1 and the second state F2 which have different concentrations of the chemical element 35. The resistance state of the variable resistance layer 30 can be controlled by changing the concentration distribution of the chemical element 35 using heat and at least one of an electric field or stress.

Also, the crystal structure of the chalcogenide compound 31 does not change in the first state F1 and the second state F2. Therefore, compared to an element in which the resistance is changed by melting the variable resistance layer 30, it is possible to perform the control of the states using a low voltage; and it is possible to increase the number of resistance changes.

In the first state F1 of the variable resistance layer 30, the variable resistance layer 30 is configured to be able to include the first region 32a1 and the second region 32b1. The first region 32a1 that has a high concentration of the chemical element 35 covers the first electrode 22. For example, the first region 32a1 contacts one of the first electrode 22 of the second electrode 23, the second region 32b1 contacts one of the first electrode 22 or the second electrode 23 not contacted by the first region 32a1, and the second region 32b1 is integrally provided between the first region 32a1 and the one of the first electrode 22 or the second electrode 23 not contacted by the first region 32a1. Thereby, the first region 32a1 that has high resistance can be provided in the current path between the first electrode 22 and the second electrode 23; and stable electrical characteristics can be obtained.

Further, for example, the surface of the first region 32a1 and the surface of the second region 32b1 are inclined with respect to the lower surface of the second electrode 23, the surface of the first region 32a1 and the surface of the second region 32b1 have a curved surface, and the radius of the curvature of the second region 32b1 is larger than the radius of the curvature of the first region 32a1. Thereby, more stable electrical characteristics can be obtained.

Further, by the variable resistance layer 30 including the chalcogenide compound 31, the difference between the resistance value of the first state F1 and the resistance value of the second state F2 of the variable resistance layer 30 can be set to be large. Further, by including the chalcogenide compound 31, the formation of the variable resistance layer 30 having the arrangement described above becomes easy.

In addition to the description recited above, for example, titanium nitride is used as the first electrode 22 and the second electrode 23. Thereby, the chemical element 35 can be prevented from penetrating inside the first electrode 22 and inside the second electrode 23.

According to the manufacturing method of the embodiment described above, it is possible to easily form the chalcogenide compound 31 that operates at a low voltage using few film formation processes and heat treatment.

Further, the chalcogenide compound 31 that withstands process temperatures of 330 degrees or more can be provided.

In addition to the description recited above, the heat amount of the Joule heat generated by the voltage applied when changing the resistance of the variable resistance layer 30 is lower than the heat amount for melting the chalcogenide compound 31. Therefore, the chalcogenide compound 31 maintains the crystal structure. In other words, control of the resistance change operation is possible at low voltage/low current that does not melt the chalcogenide compound 31.

According to the second operation method of the embodiment described above, by providing the resistor R0, different voltages can be used in the set operation S110 and the reset operation S150. Thereby, the pulse ramp-down time of the set operation S110 can be set to be short; and a high-speed operation is possible.

For example, the set operation S110 applies the voltage Vos between the first electrode 22 and the second electrode 23. At this time, the current flows in the first electrode 22, the second electrode 23, and the variable resistance layer 30 due to the voltage Vos that is lower than the minimum applied voltage Vfr used in the reset operation S150; and the Joule heat is generated. Thereby, the chemical element 35 is diffused by the heating; and the variable resistance layer 30 changes from the first state F1 to the second state F2. Therefore, the second state F2 of the variable resistance layer 30 is formed regardless of the pulse ramp-down time T2 of the set operation S110.

According to the third operation method of the embodiment described above, the negative voltage −Vt is used in the reset operation S150; and the positive voltage Vt is used in the set operation S110. In such a case, in the reset operation S150, the first state F1 can be formed even in the case where the pulse ramp-down time is long due to the effects of the parasitic capacitance and the resistance when applying the negative voltage −Vt and modifying to 0 V. In other words, it is possible to not form the second state F2 when the negative voltage −V is applied.

Second Embodiment

Figure 11A:
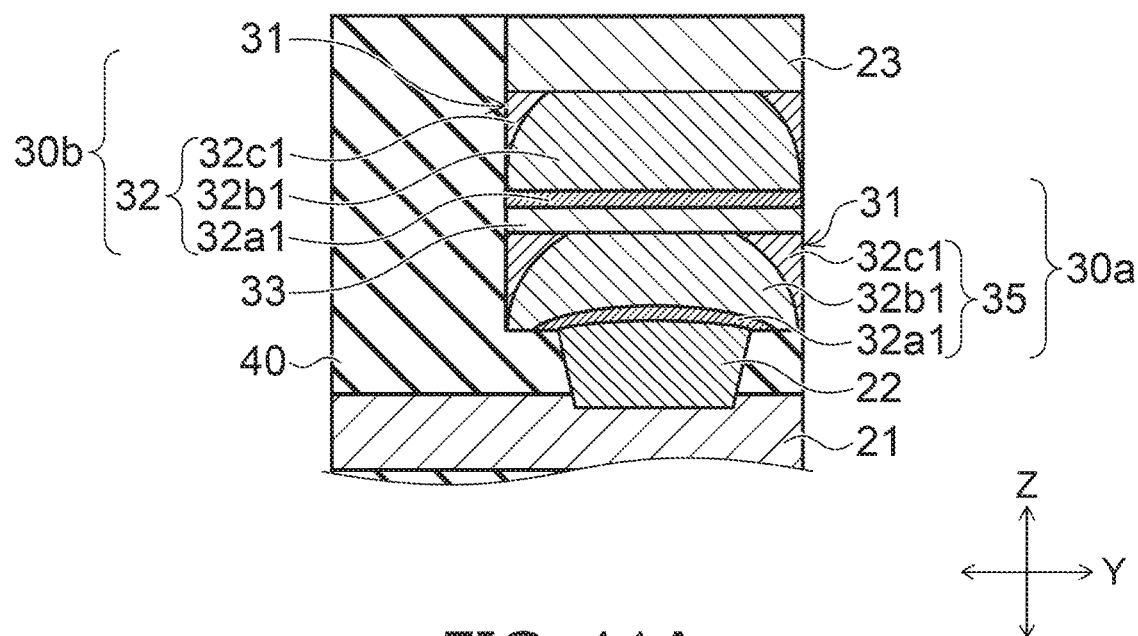
FIG. 11A and FIG. 11B are schematic cross-sectional views of a variable resistance layer of a second embodiment.
Figure 11B:
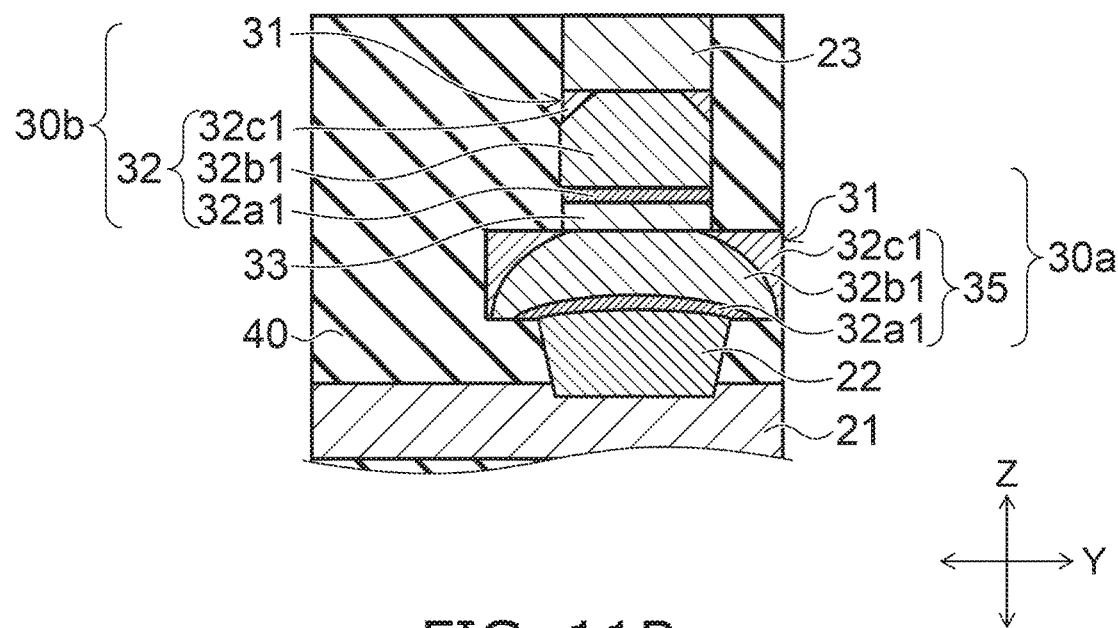

FIG. 11A and FIG. 11B are schematic cross-sectional views of the variable resistance layer 30 of a second embodiment.

The embodiment differs from the embodiment described above in that multiple variable resistance layers 30a and 30b are provided. A description is omitted for the states of the variable resistance layer 30 similar to those of the embodiment described above.

As shown in FIG. 11A, the variable resistance layer 30b is provided, with a metal layer 33 interposed, on the variable resistance layer 30a provided on the first electrode 22. Although there are two variable resistance layers in the embodiment, the number of variable resistance layers is arbitrary.

Similarly to the embodiment described above, the variable resistance layers 30a and 30b include the chalcogenide compound 31 and the chemical element 35. For example, the amount of the chemical element 35 included in the variable resistance layer 30a is different from the amount of the chemical element 35 included in the variable resistance layer 30b. The metal layer 33 includes, for example, a material that is different from the electrode (one of the first electrode 22 or the second electrode 23).

As shown in FIG. 11B, for example, when viewed from the Z-direction, the surface area of the variable resistance layer 30a is greater than the surface area of the variable resistance layer 30b and greater than the surface area of the metal layer 33.

According to the embodiment, similarly to the embodiment described above, the variable resistance layer 30 has the first state F1 and the second state F2 that have different concentration distributions of the chemical element 35. Thereby, effects similar to those of the embodiment described above are obtained; and, for example, it is possible to control the states using a low voltage.

In addition to the description recited above, the amount of the chemical element 35 included inside the variable resistance layer 30a is different from the amount of the chemical element 35 included inside the variable resistance layer 30b. Thereby, mutually-different states can be formed when the same voltage is applied to the variable resistance layers 30a and 30b. In other words, multi-level memory that uses the variable resistance layers 30a and 30b is possible.

For example, there are four types of combinations of the multi-level memory of the variable resistance layers 30a and 30b, i.e., both the variable resistance layers 30a and 30b being in the first state F1, the variable resistance layer 30a being in the first state F1 and the variable resistance layer 30b being in the second state F2, the variable resistance layer 30a being in the second state F2 and the variable resistance layer 30b being in the first state F1, and both the variable resistance layers 30a and 30b being in the second state F2.

Further, the metal layer 33 includes a material that is different from the electrodes 22 and 23. Therefore, the specific heat of the metal layer 33 is different from the specific heats of the electrodes 22 and 23. Thereby, mutually-different heat amounts are provided when the same voltage is applied to the variable resistance layers 30a and 30b. Thereby, the variable resistance layers 30a and 30b can be formed in mutually-different states. In other words, multi-level memory that uses the variable resistance layers 30a and 30b is possible.

The metal layer 33 may include the same material as the electrodes 22 and 23. In such a case, by controlling the diameter of the electrodes 22 and 23 and the metal layer 33, the current density of the electrodes 22 and 23 and inside the metal layer 33 are able to be controlled. Thus, each of temperature of the electrodes 22 and 23 and the metal layer 33 is able to be controlled; and effects similar to the content described above are obtained.

Further, when viewed from the Z-direction, the surface area of the variable resistance layer 30a is greater than the surface area of the variable resistance layer 30b and greater than the surface area of the metal layer 33. Thereby, mutually-different heat amounts are provided when the same voltage is applied to the variable resistance layers 30a and 30b. Thereby, the variable resistance layers 30a and 30b are formed in mutually-different states. In other words, multi-level memory using the variable resistance layers 30a and 30b is possible.

When viewed from the Z-direction, the surface area of the variable resistance layer 30a may be less than the surface area of the variable resistance layer 30b and less than the surface area of the metal layer 33; and it is sufficient for the surface areas of the variable resistance layers 30a and 30b to be different. Even in such a case, effects similar to the content described above are obtained.

Third Embodiment

Figure 12A:
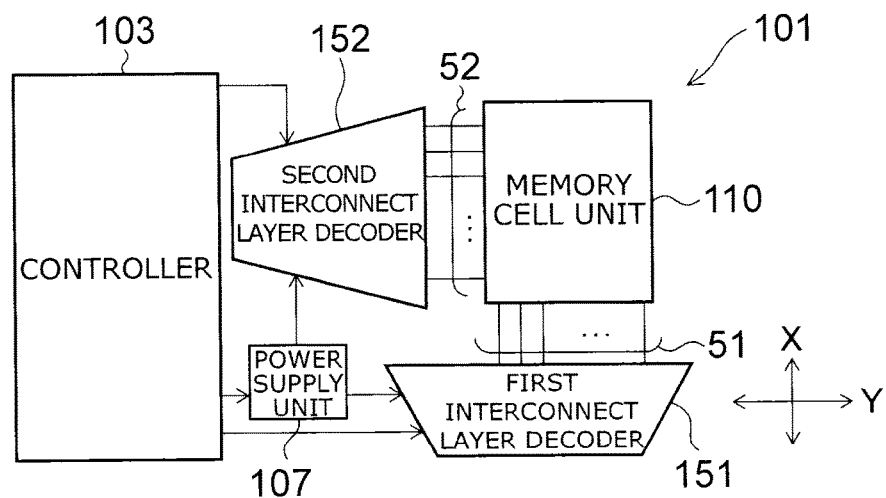
FIG. 12A is a circuit diagram of a memory device of a third embodiment.
Figure 12B:
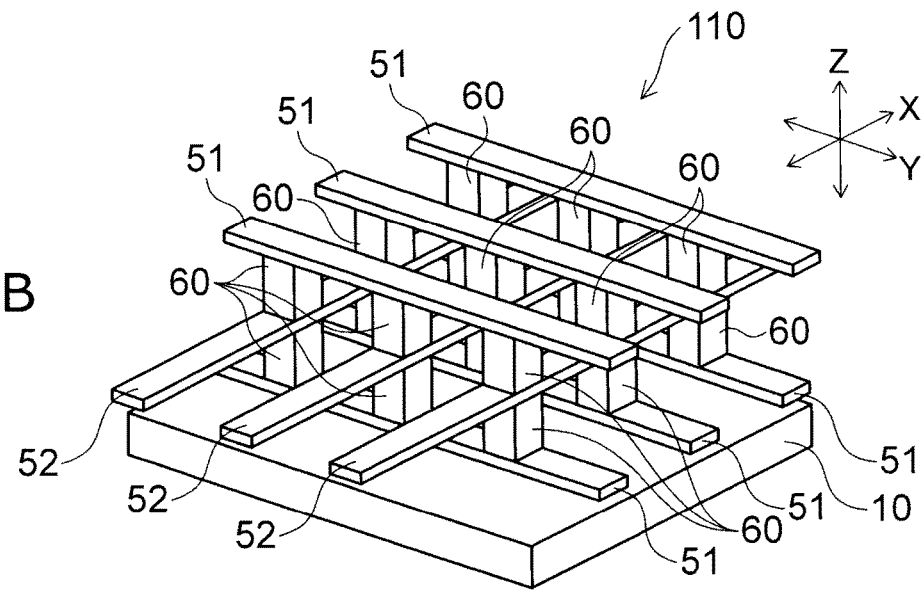
FIG. 12B is a schematic perspective view of a memory cell unit of the third embodiment.

FIG. 12A is a circuit diagram of a memory device 101 of a third embodiment; and FIG. 12B is a schematic perspective view of a memory cell unit 110 of the third embodiment. In FIG. 12B as well, some of the insulating layers, etc., are not shown for easier viewing of the drawing.

Figure 12C:
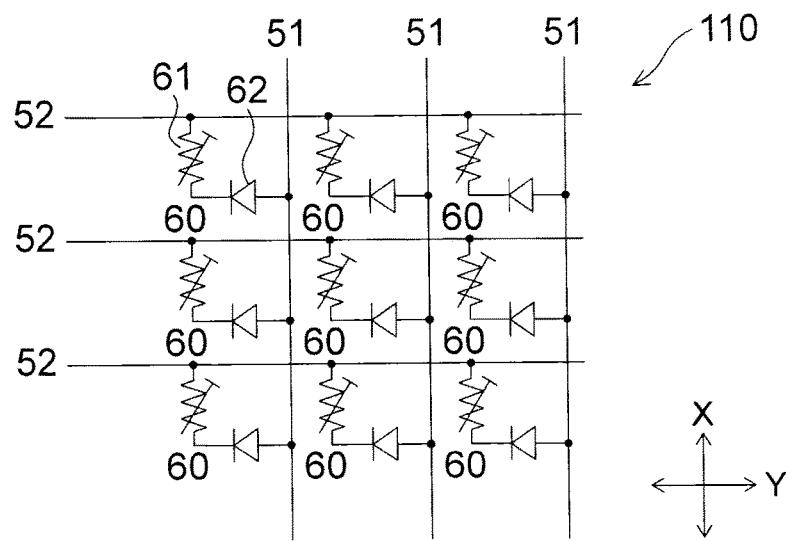
FIG. 12C is a circuit diagram of the memory cell unit of the third embodiment.

FIG. 12C is a circuit diagram of the memory cell unit 110 of the third embodiment.

The memory device 101 of the embodiment is a cross-point memory device. A description is omitted for the states of the variable resistance layer 61 similar to those of the embodiments described above.

As shown in FIG. 12A, the memory device 101 of the embodiment includes the memory cell unit 110, a controller 103, a first interconnect layer decoder 151, a second interconnect layer decoder 152, and a power supply unit 107. The controller 103, the first interconnect layer decoder 151, the second interconnect layer decoder 152, and the power supply unit 107 are similar to those of the embodiments described above; and a description is omitted.

As shown in FIG. 12B, the memory cell unit 110 is provided on the substrate 10 with a not-shown insulating layer interposed.

In the memory cell unit 110, multiple first interconnect layers 51 (bit lines) that extend in the X-direction (a first direction) parallel to the upper surface of the substrate 10 are provided; and multiple second interconnect layers 52 (word lines) that extend in the Y-direction (a second direction) intersecting the X-direction and parallel to the upper surface of the substrate 10 are provided. The first interconnect layers 51 and the second interconnect layers 52 are stacked alternately with insulating films interposed. Also, the first interconnect layers 51 do not contact each other; the second interconnect layers 52 do not contact each other; and the first interconnect layers 51 do not contact the second interconnect layers 52.

A pillar 60 that extends in a direction (the Z-direction) perpendicular to the upper surface of the substrate 10 is provided at the most proximal lines of the first interconnect layers 51 and the second interconnect layers 52. The pillars 60 are provided between the first interconnect layers 51 and the second interconnect layers 52.

As shown in FIG. 12B, the variable resistance layer 61 and a diode 62 are provided inside one pillar 60. In other words, the memory device 101 is a cross-point device in which the variable resistance layer 61 is provided at each most proximal point between the first interconnect layers 51 and the second interconnect layers 52.

Similarly to the variable resistance layer 30 of the embodiments described above, the variable resistance layer 61 includes the chalcogenide compound 31 and the chemical element 35.

Effects of the embodiment will now be described.

According to the embodiment, similarly to the embodiments described above, the variable resistance layer 61 has the first state F1 and the second state F2 which have different concentrations of the chemical element 35. Thereby, effects similar to those of the embodiments described above are obtained; and, for example, it is possible to control the states using a low voltage.

In addition to the description recited above, according to the third operation method of the embodiments described above, the reset operation S150 applies the negative voltage −Vt; and the set operation S110 applies the positive voltage Vt.

For example, in the reset operation S150, when the positive voltage Vt is applied similarly to the set operation S110, there is a possibility that misoperations of the variable resistance layers 61b (the half-selected elements) other than the selected variable resistance layer 61a may occur.

Therefore, in the reset operation S150, it is possible to prevent the misoperations of the half-selected elements by applying the negative voltage −Vt that is different from that of the set operation S110.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A memory device, comprising:
    a first electrode;
    a second electrode;
    a variable resistance layer provided between the first electrode and the second electrode, the variable resistance layer including a first region and a second region, the first region being in contact with the first electrode, the second region being in contact with the first region and the second electrode, and both of the first region and the second region including a chalcogenide compound having a crystal structure in a first state and a second state and at least one chemical element of germanium, silicon, or carbon, wherein a concentration of the chemical element in the second region is lower than that of the first region in the first state and the second state; and
    a control circuit configured to perform a first operation to make the variable resistance layer the first state having a first concentration of the chemical element in the first region, and to perform a second operation to make the variable resistance layer the second state having a second concentration of chemical element in the first region, the first concentration being higher than the second concentration.

2. The memory device according to claim 1, wherein the chemical element is included inside the crystal structure of the chalcogenide compound.

3. The memory device according to claim 1, wherein the chalcogenide compound is a compound of:
    at least one type of chemical element selected from a first group and a second group, the first group including germanium, silicon, and carbon, the second group including titanium, vanadium, copper, zinc, chrome, zirconium, platinum, palladium, molybdenum, nickel, manganese, hafnium, bismuth, and antimony; and
    at least one type of chemical element selected from a third group including sulfur, selenium, and tellurium.

4. The device according to claim 1, wherein a concentration of the chemical element is decreased from the first region to the second region.

5. The device according to claim 1, wherein the chemical element in the first region is aggregated while the variable resistance layer is the first state.

6. The device according to claim 1, wherein the chemical element has a positively charged state or a cationic state.

7. The device according to claim 1, wherein the chemical element of the first region is Germanium.

8. The device according to claim 1, wherein the control circuit is configured to apply a first voltage to the second electrode and decrease the first voltage during a first period in the first operation, to apply a second voltage to the second electrode and decrease the second voltage during a second period longer than the first period in the second operation.

9. The device according to claim 8, wherein the chemical element is gathered in a lower voltage side.

10. A memory device, comprising:
    a variable resistance layer provided between a first electrode and a second electrode, the variable resistance layer including a first region and a second region, the first region being in contact with the first electrode, the second region being in contact with the second electrode and the first region, the variable resistance layer including chalcogenide compound having a crystal structure, the variable resistance layer including at least one chemical element of germanium, silicon, or carbon, wherein a concentration of the chemical element in the second region is lower than that of the first region in a first state and a second state; and
    a control circuit configured to perform a first operation to make the variable resistance layer the first state having a first concentration of the chemical element in the first region, the variable resistance layer of the first state being a crystal structure, and to perform a second operation to make the variable resistance layer the second state having a second concentration of chemical element in the first region, the variable resistance layer of the second state being a crystal structure, the first concentration being higher than the second concentration.

11. The device according to claim 10, wherein a concentration of the chemical element is decreased from the first region to the second region.

12. The device according to claim 10, wherein the chemical element in the first region is aggregated while the variable resistance layer is the first state.

13. The device according to claim 12, wherein the chemical element has a positively charged state or a cationic state.

14. The device according to claim 10, wherein the chemical element of the first region is Germanium.

15. The device according to claim 10, wherein the control circuit is configured to apply a first voltage to the second electrode and decrease the first voltage during a first period in the first operation, and to apply a second voltage to the second electrode and decrease the second voltage during a second period longer than the first period in the second operation.

16. A memory device, comprising:
    a plurality of memory cells, each of which includes a first electrode, a second electrode, and a variable resistance layer being provided between the first electrode and the second electrode, the variable resistance layer including a first region in contact with the first electrode and a second region in contact with the second electrode, the first region being continuous to the second region, both of the first region and the second region including chalcogenide compound having a crystal structure and at least one chemical element of germanium, silicon, or carbon, wherein a concentration of the chemical element in the second region is lower than that of the first region in a first state and a second state;
    wherein the plurality of memory cells include at least a first memory cell in the first state representing first data and a second memory cell in the second state representing second data, wherein a first gradient of the chemical element in the first region in the first state is higher than a second gradient of the chemical element in the second region.

17. The device according to claim 16, wherein the chemical element is Germanium.

18. The device according to claim 16, wherein the concentration of the chemical element in the first region and the second region decreases as the distance from the first electrode increases.

19. The device according to claim 16, wherein the first electrode is connected to a bit line extending in a first direction, the second electrode is connected to a word line extending in a second direction different from the first direction, the variable resistance layer being provided between the first electrode and the second electrode in a third direction perpendicular to the first direction and the second direction.

* * * * *